(12) United States Patent
Okuyama

(10) Patent No.: US 6,462,354 B1
(45) Date of Patent: Oct. 8, 2002

(54) SEMICONDUCTOR DEVICE AND SEMICONDUCTOR LIGHT EMITTING DEVICE

(75) Inventor: Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/575,236

(22) Filed: May 22, 2000

(30) Foreign Application Priority Data

May 24, 1999 (JP) .......................................... 11-143218

(51) Int. Cl.$^7$ .............................................. H01L 29/06
(52) U.S. Cl. .............................. 257/13; 257/96; 257/97; 257/103
(58) Field of Search ............................... 257/13, 21, 79, 257/96, 97, 103; 372/43, 44, 45

(56) References Cited

U.S. PATENT DOCUMENTS

| 5,344,791 | A | * | 9/1994 | Huang | 437/126 |
| 5,358,897 | A | * | 10/1994 | Valster et al. | 437/129 |
| 5,909,036 | A | | 6/1999 | Tanaka et al. | |
| 6,204,084 | B1 | * | 3/2001 | Sugiura et al. | 438/46 |
| 6,233,264 | B1 | * | 5/2001 | Sato | 372/45 |
| 6,258,614 | B1 | * | 7/2001 | Kaneko | 438/22 |

FOREIGN PATENT DOCUMENTS

| JP | 242770 | 2/1990 |
| JP | 2257679 | 10/1990 |
| JP | 3318625 | 9/1991 |
| JP | 5183189 | 7/1993 |
| JP | 7249820 | 9/1995 |
| JP | 832113 | 2/1996 |
| JP | 1074980 | 3/1998 |
| JP | 11233822 | 8/1999 |
| JP | 11261105 | 9/1999 |

* cited by examiner

*Primary Examiner*—Sara Crane
(74) *Attorney, Agent, or Firm*—Sonnenschein, Nath & Rosenthal

(57) ABSTRACT

There are provided a semiconductor light emitting device using high-quality and high-performance nitride III–V compound semiconductors which can reduce the threshold current density and operation voltage, and can shorten the emission wavelength to the ultraviolet range and a semiconductor device using nitride III–V compound semiconductors excellent in electric property and optical property and having a high band gap. In a GaN semiconductor light emitting device, desired layers among a plurality of semiconductor layers forming its light emitting structure are made of nitride III–V compound semiconductors containing B while limiting the B composition not higher than 0.3. More specifically, sequentially stacked on a c-plane sapphire substrate are, via a $B_{0.05}Ga_{0.95}N$ buffer layer, a $B_{0.05}Ga_{0.95}N$ layer, n-type $B_{0.02}Al_{0.03}Ga_{0.95}N$ cladding layer, n-type GaN optical guide layer, active layer having a MQW structure including quantum well layers of $Ga_{0.85}In_{0.15}N$, p-type $B_{0.1}Ga_{0.9}N$ cap layer, p-type GaN optical guide layer, p-type $B_{0.02}Al_{0.03}Ga_{0.95}N$ cladding layer and p-type $B_{0.02}Ga_{0.96}N$ contact layer.

31 Claims, 8 Drawing Sheets

SEMICONDUCTOR DEVICE AND SEMICONDUCTOR LIGHT EMITTING DEVICE

BACKGROUND OF THE INVENTION

1. Field of the Invention

This invention relates to a semiconductor device and a semiconductor light emitting device, and in particular, those using nitride III–V compound semiconductors.

2. Description of the Related Art

Nitride III–V compound semiconductors represented by gallium nitride (GaN) (hereinafter also called "GaN semiconductors") are hopeful materials of light emitting devices capable of emitting light in the green to blue and ultraviolet ranges, high-frequency electronic devices and environment-enduring electronic devices. Especially since light emitting diodes (LED) using GaN semiconductors were brought into practice, GaN semiconductors have become a center of attraction. Realization of semiconductor lasers using GaN semiconductors was also reported, and their application to various purposes, starting from the light source of an optical disc device, is expected.

There is known a GaN semiconductor laser having an AlGaN/GaN/GaInN SCH (separate confinement heterostructure) structure which includes a cladding layer of AlGaN, optical guide layer of GaN and active layer of GaInN. FIG. 1 shows a GaN semiconductor laser of this conventional type.

As shown in FIG. 1, in the conventional GaN semiconductor laser, sequentially stacked on a c-plane sapphire substrate 101 are, via an undoped GaN buffer layer 102 by low-temperature growth: an undoped GaN layer 103, n-type GaN contact layer 104, n-type $Al_{0.07}Ga_{0.93}N$ cladding layer 105, n-type GaN optical guide layer 106, active layer 107 having quantum well layers of undoped $Ga_{0.9}In_{0.1}N$, p-type $Al_{0.2}Ga_{0.8}N$ cap layer 108, p-type GaN optical guide layer 109, p-type $Al_{0.07}Ga_{0.93}N$ cladding layer 110 and p-type GaN contact layer 111.

Upper part of the n-type GaN contact layer 104, n-type $Al_{0.07}Ga_{0.93}N$ cladding layer 105, n-type GaN optical guide layer 106, active layer 107, p-type $Al_{0.2}Ga_{0.8}N$ cap layer 108, p-type GaN optical guide layer 109, p-type $Al_{0.07}Ga_{0.93}N$ cladding layer 110 and p-type GaN contact layer 111 have the shape of a stripe extending in a direction with a predetermined width.

On the p-type GaN contact layer 111, a stripe-shaped p-side electrode 112 such as Ni/Pt/Au electrode or Ni/Au electrode is provided, and on the n-type GaN contact layer 104 in the region adjacent to the stripe portion, an n-side electrode 113 such as Ti/Al/Pt/Au electrode is provided.

According to the knowledge of the Inventor, it has been confirmed that, from the viewpoint of realizing continuous oscillation of a GaN semiconductor, it is sufficient that the band gap between its cladding layer and active layer is not less than 500 meV. However, in conventional AlGaN/GaN/GaInN SCH-structured GaN semiconductor lasers, if the Al composition of the cladding layer is increased for the purpose of increasing the band gap between the cladding layer and the active layer, their growth becomes difficult. Additionally, since the p-type carrier concentration decreases in AlGaN with a high Al composition, resistance of the p-type cladding layer undesirably increases. These problems become more serious as the band gap of the active layer increases, namely, as the emission wavelength becomes shorter.

Furthermore, in conventional GaN semiconductor lasers, although the p-type $Al_{0.2}Ga_{0.8}N$ cap layer 108 is interposed between the active layer 107 and the p-type GaN optical guide layer 109, the p-type $Al_{0.2}Ga_{0.8}N$ cap layer 108 with a high Al composition is difficult to grow and decrease in resistance as mentioned above. In due course, there were also problems such as adverse influences to the laser property from an increase of electric resistance by the p-type $Al_{0.2}Ga_{0.8}N$ cap layer 108.

Moreover, In conventional GaN semiconductor lasers, since there is a difference in lattice constant between the sapphire substrate 101 and the GaN semiconductor layers forming the laser structure, the GaN buffer layer 102 is grown on the sapphire substrate 101 at a low temperature, and it is crystallized when GaN semiconductor layers are grown thereon for the purpose of improving the quality of the GaN semiconductors grown on the GaN buffer layer 102. However, even when the GaN buffer layer 102 by low-temperature growth is used, there is a limit in density of defects which can be decreased.

OBJECTS AND SUMMARY OF THE INVENTION

It is therefore an object of the invention to provide a high-quality, high-performance semiconductor light emitting device using nitride III–V compound semiconductors, which can be reduced in threshold current density and operation voltage and can be shortened in emission wavelength down to the ultraviolet region.

Another object of the invention is to provide a semiconductor device using nitride III–V compound semiconductors with a high band gap, having excellent electric property and optical property.

To solve the problems contained in the conventional techniques, the Inventor made studies with every efforts. Its outline is explained below.

B-based semiconductors such as BN containing boron (B) as a group III element are stable in the sense of energy, strong against high energy light such as ultraviolet light; for example, and are hopeful for the future use. In particular, with nitride III–V compound semiconductors containing B, an increase in band gap by addition of B can be expected. Further, according to the knowledge of the Inventor, it has been confirmed that II–VI compound semiconductors and other III–V compound semiconductors are more easily p-typed as the covalent bond diameter of positive ions decreases (Hiroyuki Okuyama, Akira Ishibashi, Applied Physics 65,687(1996), herein after called Document 1). Therefore, analogically inferring from Document 1, it is considered that relatively high p-type carrier concentrations can be obtained with nitride III–V compound semiconductors containing B, in which the covalent radius of positive ion elements is reduced by addition of B.

Here is taken $B_pAl_qGa_rIn_sN$ ($0<p\leq1$, $0\leq q<1$, $0<r<1$, $0\leq s<1$, $p+q+r+s=1$) as a nitride III–V compound semiconductor containing B, and reviews are made on the use of this $B_pAl_qGa_rIn_sN$ as a material of a semiconductor layer forming a light emitting structure.

In semiconductor light emitting devices, in general, it is considered desirable to make layers from the active layer to the cladding layer by using direct transition type semiconductors, taking influences of optical absorption into consideration. However, since BN is an indirect transition type semiconductor, for making mixed crystals with other direct transition type semiconductors, such as GaN and AlN, the range of composition of B must be fixed. FIG. 2 shows relations between lattice constants and energy gaps of typical GaN semiconductors. Shown in FIG. 2 are minimum energy gaps of r points and minimum energy gaps other than r points of GaN, AlN, InN and BN. If the Vegard law that a lattice constant linearly changes with composition ratio holds, the minimum of the wurtzite structure appears approximately at L point. Comparing them and calculating the intersection between direct transition and indirect transition from the interpolation, BAlN becomes an indirect transition type semiconductor with B composition not less than 10%, and BGaN becomes an indirect transition type semiconductor with B composition not less than 30%. In other words, in order to ensure that $B_pAl_qGa_rIn_sN$ be of an indirect transition type, B composition not larger than 0.3, or more preferably not more than 0.1 will be acceptable.

Further, since $B_pAl_qGa_rIn_sN$ enables an increase of the band gap by addition of B as explained above, it will be suitable as the material of the cladding layer which is desired to have a large band gap. Additionally, since $B_pAl_qGa_rIn_sN$ can be more easily increased in p-type carrier concentration than AlGaN, it is advantageous for reducing the resistance of the p-type cladding layer as well. However, when growth of $B_pAl_qGa_rIn_sN$ is taken into account, it is difficult to determine optimum growth conditions because BN and InN are extremely different in vapor pressure. Therefore, from the viewpoint of facilitating the growth, it would be desirable not to conduct addition of B and addition of In to a common layer simultaneously. Further, since quinary mixed crystals, in general, are difficult to control their growth, it is desirable to use quaternary or less mixed crystals for making the active layer that must be strictly controlled in composition. Especially, for selection of the material of the active layer, it should be taken into account that nitride III–V compound semiconductors containing B may deteriorate in optical property depending upon growth conditions, and nitride III–V compound semiconductors containing Al are liable to be oxidized and weak in optical damages. This is the case also for the optical guide layer. The same consideration is required also for the optical guide layer.

Furthermore, $B_pAl_qGa_rIn_sN$ is considered hopeful as the material of buffer layers and cap layers of GaN semiconductor lasers. When $B_pAl_qGa_rIn_sN$ is used as the buffer layer, the attachment coefficient of B is good, and the thermal stability is improved. Therefore, its growth temperature may be higher than that of a GaN buffer layer. Additionally, because of its small lattice constant, BN exhibits a firm coupling and allows less defects to enter. Therefore, when $B_pAl_qGa_rIn_sN$ is used as the buffer layer, the density of defects of the buffer layer can be reduced, and also the density of defects of a semiconductor layer grown thereon can be reduced as well. Further, if the growth temperature is 1000° C., equilibrium vapor pressure decreases from InN to GaN, AlN and BN in this order. Therefore, in order to prevent evaporation of In, the use of BN mixed crystal will be more effective.

As reviewed above, adequately using nitride III–V compound semiconductors containing B to make semiconductor layers forming a light emitting structure is considered effective to solve the problems involved in the conventional techniques.

In case of stacking a plurality of nitride III–V compound semiconductor layers containing B and those not containing B, differences in lattice constant among those layers must be taken into consideration. FIG. 3 shows relations between band gaps of representative GaN semiconductors and their lattice mismatches relative to GaN. Covalent coupling radius of B is 0.88 Å, and smaller than covalent coupling radii of Ga and Al (1.26 Å) and covalent coupling radius of In (1.44 Å). Therefore, as shown in FIG. 3, a layer containing B decreases in lattice constant as the ratio of B increases, and when it is stacked on or under a layer not containing B, a tension force is applied thereto. To solve this problem, the Inventor made researches and invented the following techniques. The first technique is making a mask having an aperture on a substrate and selectively growing semiconductor layers on the substrate exposed in the aperture. The second technique is making a mesa portion on a substrate and selectively growing semiconductor layers on the mesa portion. In these first and second techniques, semiconductor layers grow in form of a trapezoid on the growth region of the substrate, and the semiconductor layers decreases in grown area as they become away from the substrate. Therefore, cracks can be prevented.

In addition to those researches, the Inventor made further researches about optimization of the laser structure and the growth condition to improve the property of GaN semiconductor lasers.

That is, the Inventor has known from experiments conducted heretofore that an excellent laser device capable of continuous oscillation can be obtained if the band gap difference between the cladding layer and the active layer is 500 meV at the least. The Inventor also reviewed about changes in threshold current density with changes in band gap difference between the cladding layer and the active layer. FIG. 4 shows a result of the measurement. In samples used in this experiment, the stripe size was 4 μm×1 mm, and the band gap difference between the cladding layer and the active layer was changed by changing the Al composition of the p-type AlGaN cladding layer. It is known from FIG. 4 that, when the band gap difference between the cladding layer and the active layer is equal to or larger than 500 meV, the threshold current density is reduced.

Further, using GaN semiconductor lasers as shown in FIG. 1, the Inventor reviewed changes in voltage with changes in Al composition of the cladding layer by supplying a current of 1 kA/cm$^2$ in current density between electrodes. FIG. 5 shows a result of the measurement. It is known from FIG. 5 that an increase in voltage is observed when the Al composition of the cladding layer becomes 0.06 and higher, and the voltage greatly increases when the Al composition of the cladding layer becomes 0.1 and higher. Although this is the phenomenon about the Al composition of the cladding layer, the same can be said also about the B composition.

The result of the experiment shows that, from the standpoint of reducing the threshold current density of a GaN semiconductor laser, the band gap difference between the cladding layer and the active layer should be preferably 500 meV or more, and from the standpoint of reducing the operation voltage, the Al composition and the B composition of the cladding layer should be preferably 0.1 or less, and more preferably 0.06 of less.

Regarding growth conditions, in particular, the growth temperature, it is considered that nitride III–V compound semiconductors including In such as GaInN, in general, are grown at a temperature around 600° C. through 800° C., taking the problem of decomposition of InN into consideration, but nitride III–V compound semiconductors not including In, such as GaN and AlGaN are crystallographically better when grown at higher temperatures. This has been confirmed also through experiments conducted by the Inventor. FIG. 6 shows a result of measurement of the surface roughness of GaN films grown on substrates by MOCVD. The surface roughness was reviewed by investigating level differences in every 10 μm squared areas of GaN films and standardized by putting minimum values as 1. It is known from FIG. 6 that GaN films grown at temperatures not lower than 1000° C. are better in surface evenness than those grown at temperatures from 600 to 800° C. Furthermore, for growth of nitride III–V compound semiconductors containing B, it is considered preferable to use a pressurized MOCVD apparatus as disclosed in Japanese Laid-Open Publication No. hei 9-168853 because BN simple substance tends to be produced under high pressures.

The present invention has been made through those researches by the Inventor.

According to the first aspect of the invention, there is provided a semiconductor device having a plurality of semiconductor layers made of nitride III–V compound semiconductors, comprising:

the plurality of semiconductor layers including at least one layer made of a nitride III–V compound semiconductor containing B within the range of B composition not higher than 0.3.

According to the second aspect of the invention, there is provided a semiconductor light emitting device having a light emitting structure composed of a plurality of semiconductor layers which are made of nitride III–V compound semiconductors, comprising:

the plurality of semiconductor layers, which constitutes the light emitting structure, including at least one layer made of a nitride III–V compound semiconductor containing B within the range of B composition not higher than 0.3.

In the present invention, each nitride III–V compound semiconductors are composed of at least one kind of group III element selected from the group consisting of Ga, Al, In, B and Tl, and one or more group V elements which include at least N and may additionally includes As or P. Si, for example, is used as the n-type impurity introduced into the nitride III–V compound semiconductors, and Mg, Zn or Be, for example, is used as the p-type impurity.

In the present invention, a pressurized metal organic chemical vapor deposition apparatus is preferably used for growing layers of nitride III–V compound semiconductors containing B.

In the present invention, B composition of layers made of III–V compound semiconductors containing B is preferably 0.1 or less.

In the present invention, layers of nitride III–V compound semiconductors containing B are preferably made of $B_pAl_qGa_rIn_sN$ (where $0<p\leq0.3$, $0\leq q<1$, $0<r<1$, $0\leq s<1$, $p+q+r+s=1$).

In the first aspect of the invention, for the purpose of minimizing cracks and ensuring a good optical property, the plurality of semiconductor layers are preferably made by forming a mask having an aperture on a substrate and then selectively growing nitride III–V compound semiconductors on the substrate exposed in the aperture, or by forming a mesa portion on a major surface of a substrate and then selectively growing nitride III–V compound semiconductors on the mesa portion. Similarly, in the second aspect of the invention, for the purpose of minimizing cracks and ensuring a good optical property, the plurality of semiconductor layers forming the light emitting structure are preferably made by making a mask having an aperture on a substrate and then selectively growing nitride III–V compound semiconductors on the substrate exposed in the aperture, or by forming a mesa portion on a major surface of a substrate and then selectively growing nitride III–V compound semiconductors on the mesa portion.

In the second aspect of the invention, the light emitting structure preferably includes a structure including an active layer interposed between a first cladding layer and a second cladding layer, and more preferably, it additionally includes a first optical guide layer and a second optical guide layer interposed between the first cladding layer and the active layer and between the active layer and the second cladding layer, respectively.

In a first preferable combination of the material of the first and second cladding layers and the material of the active layer in the second aspect of the invention, the first and second cladding layer are made of $B_pAl_qGa_rIn_sN$ (where $0<p\leq0.3$, $0\leq q<1$, $0<r<1$, $0\leq s<1$, $p+q+r+s=1$), and the active layer is made of $Al_xGa_yIn_zN$ (where $0\leq x<1$, $0\leq y<1$, $0<z\leq1$, $x+y+z=1$). From the viewpoint of easier growth, the first and second cladding layers are more preferably made of $B_pAl_qGa_rN$ (where $0<p\leq0.3$, $0\leq q<1$, $0<r<1$, $p+q+r=1$). The first and second optical guide layers are made of $Al_aGa_bIn_cN$ (where $0\leq a<1$, $0<b\leq1$, $0\leq c<1$, $a+b+c=1$), and more preferably made of $Al_aGa_bN$ (where $0\leq a<1$, $0<b\leq1$, $a+b=1$) In this first combination, since the first and second cladding layers contain B, their band gaps can be increased. Since the active layer and the optical guide layers are made of nitride III–V compound semiconductors which are quaternary or less mixed crystals not containing B, they exhibit a good growth controllability and a good optical property. When B is introduced into the active layer and the optical guide layers if so desired, their band gaps can be increased.

In a second preferable combination of the material of the first and second cladding layers and the material of the active layer in the second aspect of the invention, the first and second cladding layers are made of $B_pAl_qGa_rIn_sN$ (where $0\leq p<0.3$, $0\leq q<1$, $0<r<1$, $0\leq s<1$, $p+q+r+s=1$), and the active layer is made of $B_xGa_yIn_zN$ (where $0\leq x\leq0.3$, $0\leq y1$, $0<z\leq1$, $x+y+z=1$). From the viewpoint of easier growth, the first and second cladding layers are more preferably made of $B_pAl_qGa_rN$ (where $0<p\leq0.3$, $0\leq q<1$, $0<r<1$, $p+q+r=1$). The first and second optical guide layers are made of $B_aGa_bIn_cN$ (where $0\leq a\leq0.3$, $0<b\leq1$, $0\leq c<1$, $a+b+c=1$), and more preferably made of $B_aGa_bN$ (where $0\leq a<1$, $0<b\leq1$, $a+b=1$). In this second combination, since the first and second cladding layers contain B, their band gaps can be increased. Since the active layer and the optical guide layers are made of nitride III–V compound semiconductors which are quaternary or less mixed crystals not containing Al, their optical damage levels can be increased. When B is introduced into the active layer and the optical guide layers if so desired, their band gaps can be increased.

In a third preferable combination of the material of the first and second cladding layers and the material of the active layer in the second aspect of the invention, the first and second cladding layer are made of $B_pAl_qGa_rN$ (where $0<p\leq0.3$, $0\leq q<1$, $0<r<1$, $p+q+r=1$), and the active layer is made of $B_xAl_yGa_zN$ (where $0\leq x\leq0.3$, $0\leq y<1$, $0<z\leq1$, $x+y+z=1$). The active layer, first cladding layer and second cladding layer are grown at temperatures not lower than 1000° C. The active layer is more preferably made of $B_xGa_zN$ (where $0\leq x\leq0.3$, $0.7\leq z\leq1$, $x+z=1$), $Al_yGa_zN$ (where $0\leq y<1$, $0<z\leq1$, $y+z=1$), or GaN. The first and second optical guide layers are made of $B_aAl_bGa_cN$ (where $0\leq a\leq0.3$, $0\leq b<1$, $0<c<1$). In this third combination, since the first and second cladding layers contain B, their band gaps can be increased. Additionally, when B and/or Al is introduced into the active layer and the optical guide layers if so desired, their band gaps can be increased. Further, since the active layer, first and second cladding layers, first and second optical guide layers are made of nitride III–V compound semiconductors not containing In, they can be grown at temperatures not lower than 1000° C., and therefore improved in crystalline property.

In the second aspect of the invention, if any of the first to third combinations is used as the combination of the material of the first and second cladding layers and the material of the active layer, the band gap difference of the first and second cladding layers from the active layer is preferably 500 meV or more for the purpose of reducing the threshold current density. Especially in the third combination, difference between the B composition of the first and second cladding layers and the B composition of the active layer is within 5%. The difference of 5% between B compositions corresponds to the difference of 500 meV between band gaps.

In the second aspect of the invention, if any of the first to third combinations is used as the combination of the material of the first and second cladding layers and the material of the active layer, the Al composition or B composition of the first and second cladding layers is 0.1 or less, and more preferably 0.06 or less.

In the second aspect of the invention, if the plurality of semiconductor layers forming the light emitting structure are stacked on the substrate via a buffer layer, $B_pAl_qGa_rIn_sN$ (where $0<p\leq1$, $0\leq q<1$, $0\leq r<1$, $0\leq s<1$, $p+q+r+s=1$) may be used as the buffer layer. In this case, if the composition is chosen to ensure that the band gap of the buffer layer is larger than the band gap of the active layer, it is possible to take out the light from the active layer from the substrate side.

In the second aspect of the invention, in the case where a cap layer is provided near the active layer to prevent evaporation of In, $B_pAl_qGa_rIn_sN$ (where $0<p\leq1$, $0\leq q<1$, $0<r<1$, $0\leq s<1$, $p+q+r+s=1$) may be used as the material of the cap layer.

According to the first and second aspects of the invention having the above-summarized configurations, by introducing B into desired one of a plurality of semiconductor layers within a range making a direct transition type, it is possible to increase its band gap, increase its p-type carrier concentration, and so on, while realizing a good optical property in the layer.

In particular, according to the second aspect of the invention, when B is introduced into the cladding layer among the plurality of semiconductor layers forming the light emitting structure, it is possible to increase the band gap of the cladding layer and thereby reduce the threshold current density, and it is advantageous also for realizing shorter emission wavelengths.

Moreover, when the buffer layer interposed between the substrate and semiconductor layers forming the light emitting structure contains B, it is possible to improve the thermal stability of the buffer layer and thereby reduce the defect density of the semiconductor layers formed thereon, and it is therefore possible to improve the optical property of the semiconductor layers.

Furthermore, when the cap layer formed near the active layer to prevent evaporation of In contains B, not only improved is the In evaporation preventing function, bu also lowered is the resistance of the cap layer. Therefore, the use of the cap layer contributes to preventing an increase of the operation voltage.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings.

First explained is the first embodiment directed to a GaN semiconductor light emitting device which uses $B_pAl_qGa_rIn_sN$ (where $0<p\leq0.3$, $0\leq q<1$, $0<r<1$, $0\leq s<1$, $p+q+r+s=1$) as cladding layers, $Al_aGa_bIn_cN$ (where $0\leq a<1$, $0<b\leq1$, $0\leq c<1$, $a+b+c=1$) as optical guide layers, and $Al_xGa_yIn_zN$ (where $0\leq x<1$, $0\leq y<1$, $0<z\leq1$, $x+y+z=1$) as the active layer. A feature of this type lies in containing B in the cladding layers, thereby increasing their band gaps to reduce the threshold current density, and at the same time not containing B in the active layer and optical guide layers to realize a good optical property. By having the active layers and optical guide layers contain Al, if necessary, their band gaps can be increased as well. A specific example is shown below and explained in detail.

Figure 1:
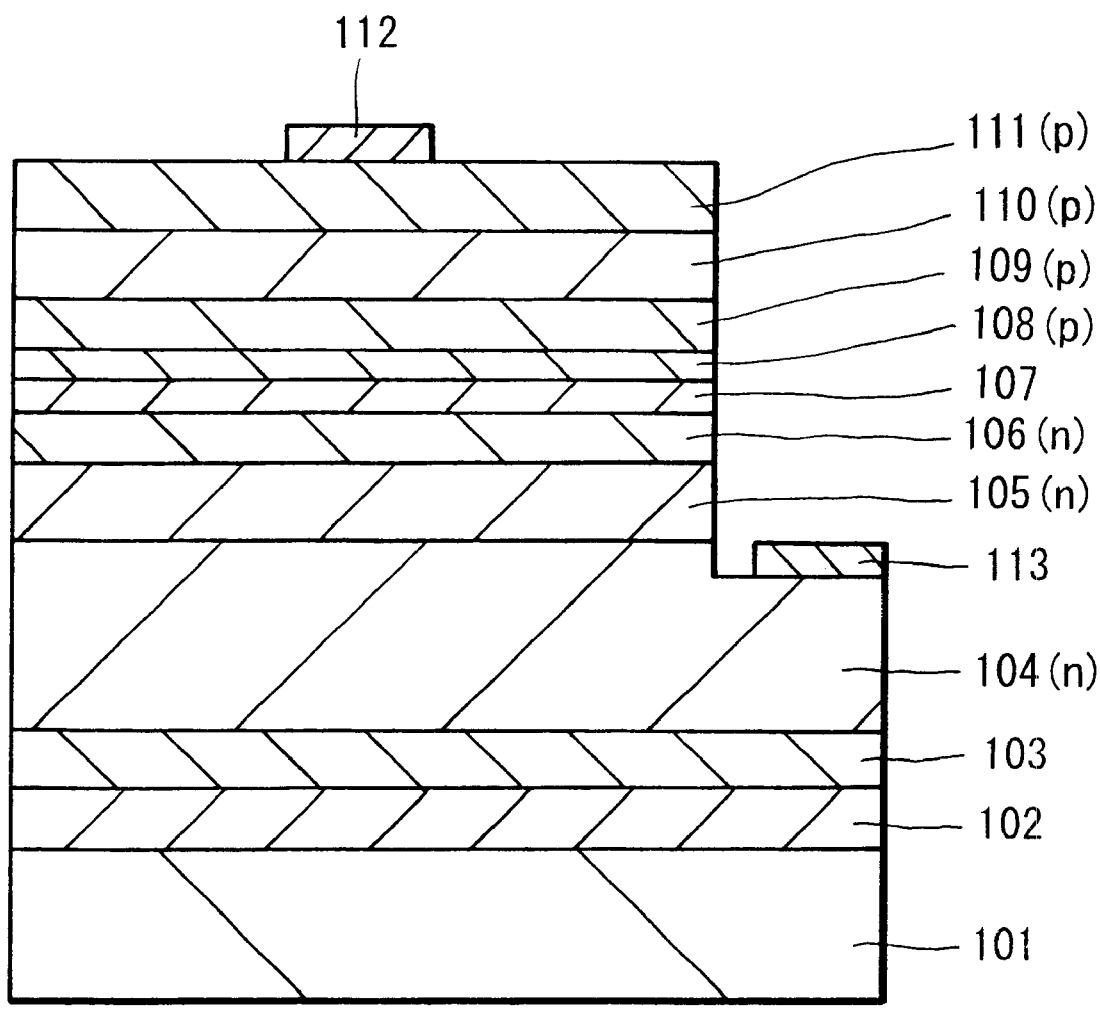
FIG. 1 is a cross-sectional view of a conventional AlGaN/GaN/GaInN SCH-structured GaN semiconductor laser.
Figure 2:
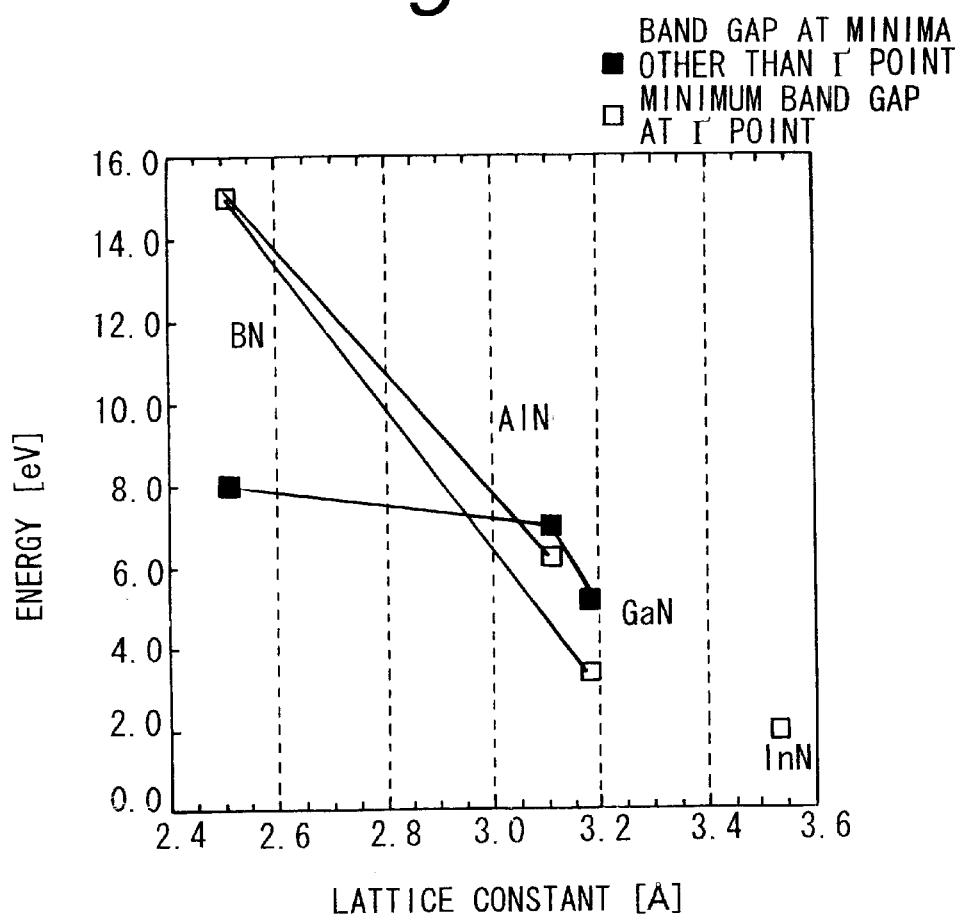
FIG. 2 is a diagram roughly showing relations between lattice constants and energy gaps of typical GaN semiconductors.
Figure 3:
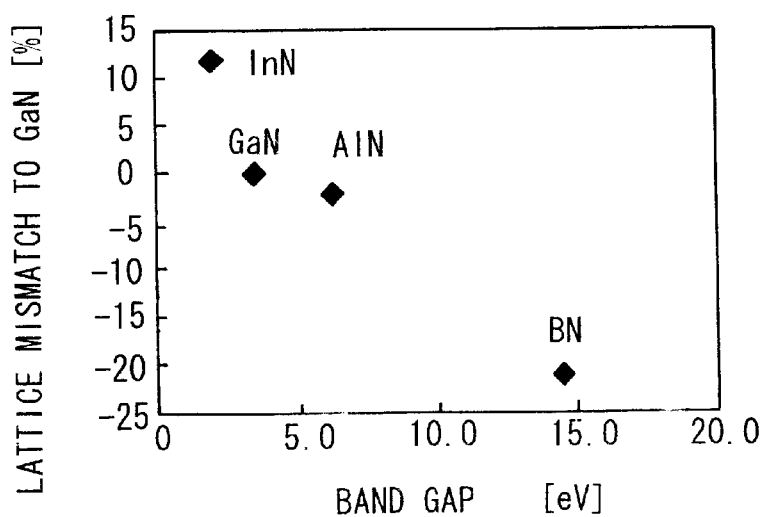
FIG. 3 is a diagram roughly showing relations between band gaps of typical GaN semiconductors and their lattice mismatching with GaN.
Figure 4:
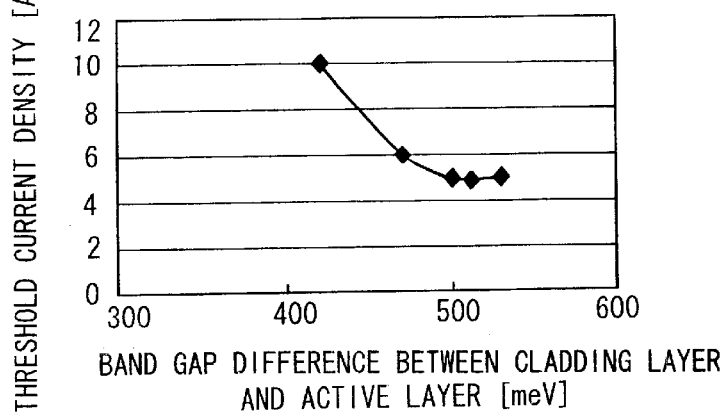
FIG. 4 is a diagram roughly showing relations of band gap differences between cladding layers and active layers in GaN semiconductor lasers with respect to threshold current densities.
Figure 5:
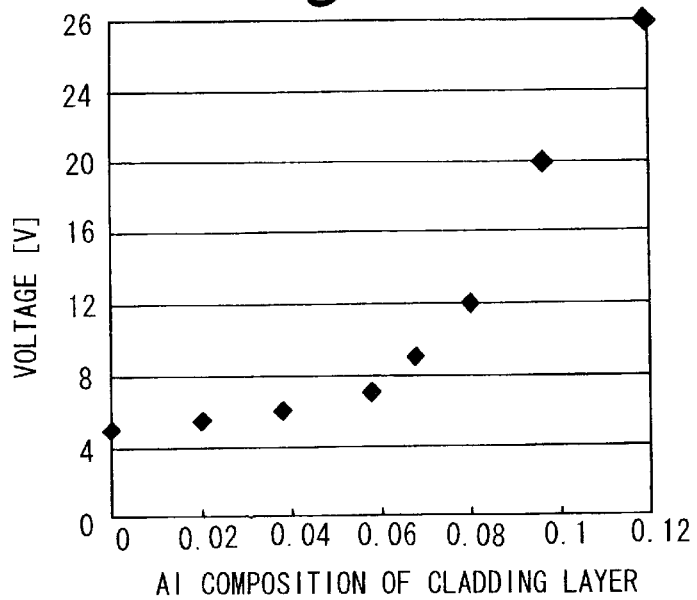
FIG. 5 is a diagram roughly showing relations between Al compositions of cladding layers and voltages in GaN semiconductor lasers.
Figure 6:
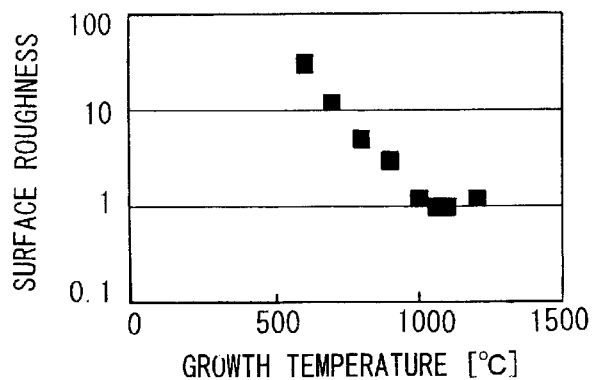
FIG. 6 is a diagram roughly showing relations between growth temperatures and surface roughness of GaN films.
Figure 7:
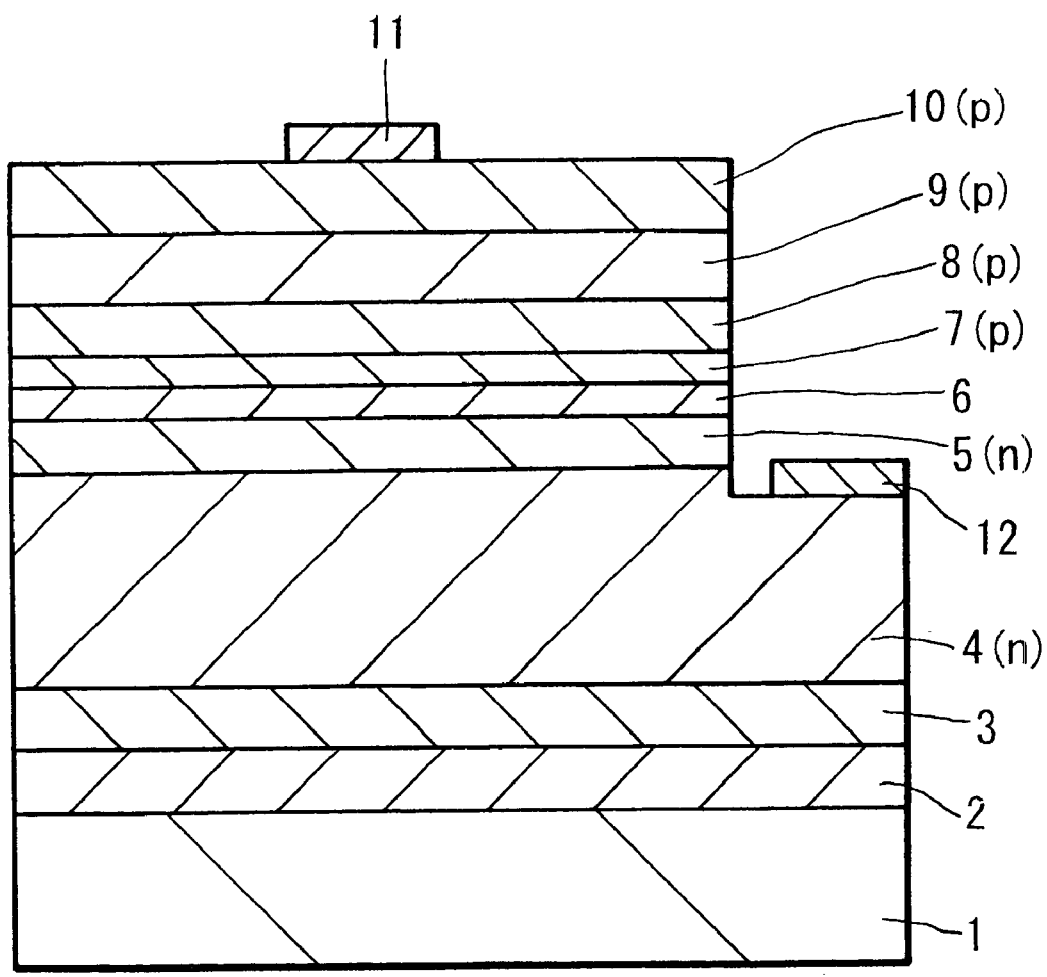
FIG. 7 is a cross-sectional view of a BAlGaN/GaN/GaInN SCH-structured GaN semiconductor laser according to the first embodiment of the invention.

FIG. 7 is a cross-sectional view of a GaN semiconductor laser according to the first embodiment of the invention. The GaN semiconductor laser according to the first embodiment has a SCH structure using BAlGaN as its cladding layers, GaN as the optical guide layers and GaInN as the active layer. The active layer has a multi-quantum well (MQW) structure.

As shown in FIG. 7, in the GaN semiconductor laser according to the first embodiment, sequentially stacked on a c-plane sapphire substrate 1, for example, are, via an undoped $B_{0.05}Ga_{0.95}N$ buffer layer 2 by low-temperature growth: an undoped $B_{0.05}Ga_{0.95}N$ layer 3, n-type $B_{0.02}Al_{0.03}Ga_{0.95}N$ cladding layer 4, n-type GaN optical guide layer 5, active layer 6 having a MQW structure including quantum well layers of undoped $Ga_{0.85}In_{0.15}N$, p-type $B_{0.1}Ga_{0.9}N$ cap layer 7, p-type GaN optical guide layer 8, p-type $B_{0.02}Al_{0.03}Ga_{0.95}N$ cladding layer 9 and p-type $B_{0.02}Ga_{0.98}N$ contact layer 10.

The $B_{0.05}Ga_{0.95}N$ buffer layer 2 is 30 nm thick, for example. The $B_{0.05}Ga_{0.95}N$ layer 3 is 1 μm thick, for example. Band gaps of these $B_{0.05}Ga_{0.95}$ N buffer layer 2 and $B_{0.05}Ga_{0.95}N$ layer 3 are 3.96 eV. The $B_{0.05}Ga_{0.95}N$ buffer layer 2 can be grown at a higher temperature than a conventional GaN buffer layer (more stable thermally) and can decrease the defect density of layers grown thereon.

The n-type $B_{0.02}Al_{0.3}Ga_{0.95}N$ cladding layer 4 is 3 μm thick, for example, and doped with Si, for example, as the n-type impurity. Band gap of this n-type $B_{0.02}Al_{0.03}Ga_{0.95}N$ cladding layer 4 is 3.71 eV.

The n-type GaN optical guide layer 5 is 100 nm thick, for example, and doped with Si, for example, as the n-type impurity. Band gap of this n-type GaN optical guide layer 5 is 3.4 eV.

Each quantum well layer of $Ga_{0.85}In_{0.15}N$ of the active layer 6 is 3.5 nm thick, for example. Band gap of the quantum well layer of $Ga_{0.85}In_{0.15}N$ of the active layer 6 is 3.05 eV. In this case, emission wavelength is about 400 nm, and blue-violet light can be emitted.

The p-type $B_{0.1}Ga_{0.9}N$ cap layer 7 is 10 nm thick, for example, and doped with Mg, for example, as the p-type impurity. Band gap of this p-type $B_{0.1}Ga_{0.9}N$ cap layer 7 is 4.51 eV. The p-type $B_{0.1}Ga_{0.9}N$ cap layer 7 is more effective in preventing evaporation of In than conventional p-type AlGaN cap layer, and also has a higher p-type carrier concentration and a low resistance.

The p-type GaN optical guide layer 8 is 100 nm thick, for example, and doped with Mg, for example, as the p-type impurity. Band gap of this p-type GaN optical guide layer 8 is 3.4 eV.

The p-type $B_{0.02}Al_{0.03}Ga_{0.95}N$ cladding layer 9 is 1 μm thick, for example, and doped with Mg, for example, as the p-type impurity. Band gap of this p-type $B_{0.02}Al_{0.03}Ga_{0.95}N$ cladding layer 9 is 3.71 eV.

The p-type $B_{0.02}Ga_{0.98}N$ contact layer 10 is 100 nm thick, for example, and doped with Mg, for example, as the p-type impurity. Band gap of this p-type $B_{0.02}Ga_{0.09}N$ contact layer 10 is 3.62 eV.

Upper part of the n-type $B_{0.02}Al_{0.03}Ga_{0.95}N$ cladding layer 4, n-type optical guide layer 5, active layer 6, p-type $B_{0.01}Ga_{0.09}N$ cap layer 7, p-type GaN optical guide layer 8, p-type $B_{0.02}Al_{0.03}Ga_{0.95}N$ cladding layer 9 and p-type $B_{0.02}Ga_{0.98}N$ contact layer 10 have the form of a stripe extending in one direction with a predetermined width.

A stripe-shaped p-side electrode 11 such as Ni/Pt/Au electrode or Ni/Au electrode, for example, is provided on the p-type $B_{0.02}Ga_{0.98}N$ contact layer 10. On the n-type $B_{0.02}Al_{0.03}Ga_{0.95}N$ cladding layer 4 in the region adjacent to the stripe portion, an n-side electrode 12 such as Ti/Al/Pt/Au electrode, for example, is provided.

Next explained is a manufacturing method of the GaN semiconductor laser according to the first embodiment.

For manufacturing the GaN semiconductor laser according to the first embodiment, first of all, the sapphire substrate 1 is heated to 1050° C., for example, for thermal cleaning of its surface. After that, while maintaining the surface of the sapphire substrate 1 clean, the undoped $B_{0.05}Ga_{0.95}N$ buffer layer 2 is grown thereon by low-temperature growth setting the temperature at 500° C., for example, by MOCVD. Subsequently, sequentially stacked by MOCVD on the $B_{0.05}Ga_{0.095}N$ buffer layer 2 are: the undoped $B_{0.03}Ga_{0.95}N$ layer 3, n-type $B_{0.02}Al_{0.03}Ga_{0.95}N$ cladding layer 4, n-type GaN optical guide layer 5, active layer 6 having the MQW structure including quantum well layers of undoped $Ga_{0.85}In_{0.15}N$, p-type $B_{0.1}Ga_{0.9}N$ cap layer 7, p-type GaN optical guide layer 8, p-type $B_{0.02}Al_{0.03}Ga_{0.95}N$ cladding layer 9 and p-type $B_{0.02}Ga_{0.98}N$ contact layer 10. For growth of the undoped $B_{0.05}Ga_{0.95}N$ layer 3, n-type $B_{0.02}Al_{0.03}Ga_{0.95}N$ cladding layer 4, n-type GaN optical guide layer 5, p-type GaN optical guide layer 8, p-type $B_{0.02}Al_{0.03}Ga_{0.95}N$ cladding layer 9 and p-type $B_{0.02}Ga_{0.98}N$ contact layer 10, the growth temperature is about 1000° C., for example. For growth of the active layer 6 and the p-type $B_{0.1}Ga_{0.9}N$ cap layer 7, the temperature is held at about 800° C., for example, for the purpose of preventing decomposition of InN.

For growth of GaN semiconductor layers forming the laser structure, a pressurized MOCVD apparatus is used, for example. Here are used trimethyl gallium (TMGa) or triethyl gallium (TEGa) as the source material of group III element Ga, trimethyl aluminum (TMAl) or triethyl aluminum (TEAl) as the source material of group III element Al, trimethyl indium (TMIn) or triethyl indium (TEIn) as the source material of group III element In, trimethyl boron (TMB) or trimethyl boron (TEB) as the source material of group III element B. and ammonium ($NH_3$) or hydrazine-based source material (such as dimethyl hydrazine (DMHy)) as the source material of group V element N. Used as the carrier gas is a mixed gas of $H_2$ and $N_2$. Further, monosilane ($SiH_4$) is used as the dopant of the n-type impurity, and bis-methylcyclopentadienile magnesium (($MeCp)_2Mg$) is used as the dopant of the p-type impurity.

After the GaN semiconductor layers forming the laser structure are stacked on the sapphire substrate 1, they undergo a processing, if necessary, for electrical activation of impurities introduced into the GaN semiconductor layers, in particular, the p-type impurity, by thermal annealing (for example, Japanese Patent Laid-Open Publication No. hei 5-183189), electron beam irradiation (for example, Japanese Patent Laid-Open Publication No. hei 2-42770, Japanese Patent Laid-Open Publication No. hei 2-257679, Japanese Patent Laid-Open Publication No. hei 3-218625), or cooling method (Japanese Patent Laid-Open Publication No. hei 8-32113). Layers containing B exhibit the tendency of reducing covalent coupling radii of positive ions and increasing the ratio of activated p-type impurities due to addition of B. Therefore, high p-type concentrations are obtained in the p-type $B_{0.02}A_{0.03}Ga_{0.95}N$ cladding layer 9 and the p-type $B_{0.02}Ga_{0.98}N$ contact layer 10.

Thereafter, making a resist pattern shaped into a predetermined stripe on the p-type $B_{0.02}Ga_{0.98}N$ contact layer 10 and using this resist pattern as a mask, etching by RIE is conducted to the depth reaching a half depth of the n-type $B_{0.02}Al_{0.03}Ga_{0.95}N$ cladding layer 4. Then, after removing the resist pattern, the p-side electrode 11 is formed on the p-type $B_{0.02}Ga_{0.98}N$ contact layer 10, and the n-side electrode 12 is formed on the part of the n-type $B_{0.02}Al_{0.03}Ga_{0.95}N$ cladding layer 4 exposed by etching.

Thereafter, opposite cavity edges are formed by etching the GaN semiconductor layers forming the laser structure by RIE, the sapphire substrate 1 is processed into bars, and each bar is divided into chips. Cavity edges may be formed by cleaving the sapphire substrate 1 together with the GaN semiconductor layers thereon, instead. Through these steps, the intended SCH-structured GaN semiconductor laser is completed as shown in FIG. 7.

The first embodiment having the above-explained configuration has various advantages shown below.

That is, according to the first embodiment, since the n-type cladding layer and the p-type cladding layer contain B and have a large band gap, they effectively confines carriers. Additionally, since the p-type carrier concentration of the p-type cladding layer can be increased by addition of B, resistance of the p-type cladding layer can be reduced. As a result, here is obtained the first advantage, namely, realization of a high-performance GaN semiconductor laser which is low in both the threshold current density and operation voltage. Especially in the first embodiment, since the band gap difference between the cladding layers and the active layer and the Al composition and B composition of the cladding layers are optimizes, respectively, the threshold current density and the operation voltage can be reduced more.

Moreover, according to the first embodiment, since the $B_{0.05}Ga_{0.95}N$ buffer layer 2 having a lower defect density is used instead of a conventional GaN buffer layer, here is obtained the second advantage, namely, improvement of the quality of GaN semiconductor layers grown thereon to form the laser structure.

Furthermore, according to the first embodiment, since it uses the p-type $B_{0.1}Ga_{0.9}N$ cap layer 7 having a high effect of preventing evaporation of In and enabling to increase the p-type carrier concentration instead of a conventional p-type AlGaN cap layer, it ensures the third advantage, namely, improving the quality of the active layer, and prevention of an increase of the operation voltage by the resistance of the cap layer.

Next explained is the second embodiment of the invention. A GaN semiconductor laser taken as the second embodiment has a SCH structure including cladding layers of BAlGaN, optical guide layers of AlGaN and active layer of AlGaInN. The active layer has a MQW structure.

More specifically, in the GaN semiconductor layer according to the second embodiment, there are used an n-type $Al_{0.02}Ga_{0.98}N$ optical guide layer and a p-type $Al_{0.02}Ga_{0.98}N$ optical guide layer instead of the n-type GaN optical guide layer 5 and the p-type GaN optical guide layer 8, respectively, and an active layer of a MQW structure having quantum layers of undoped $Al_{0.02}Ga_{0.83}In_{0.15}N$ instead of the active layer 6 of the MQW structure having the quantum well layers of undoped $Ga_{0.85}In_{0.15}N$. Band gap of the n-type $Al_{0.02}Ga_{0.98}N$ optical guide layer and the p-type $Al_{0.02}Ga_{0.98}N$ is 3.45 eV, and band gap of the $Al_{0.02}Ga_{0.83}In_{0.15}N$ quantum well layer is 3.10 eV. In this case, emission wavelength is about 400 nm, and blue-violet light can be emitted.

In the other respects, configuration of the GaN semiconductor laser according to the second embodiment is the same as the GaN semiconductor laser according to the first embodiment, and their explanation is omitted.

According to the second embodiment, the same advantages as the first to third advantages of the first embodiment can be obtained in the BAlGaN/AlGaN/AlGaInN SCH-structured GaN semiconductor laser capable of emitting blue-violet light.

Next explained is the third embodiment of the invention.

A GaN semiconductor laser taken as the third embodiment has a SCH structure including cladding layers of BAlGaN, optical guide layers of AlGaN and active layer of GaInN. The active layer has a MQW structure.

More specifically, in the GaN semiconductor layer according to the third embodiment, there are used an n-type $B_{0.03}Al_{0.03}Ga_{0.94}N$ cladding layer and a p-type $B_{0.03}Al_{0.03}Ga_{0.94}N$ cladding layer instead of the n-type $B_{0.02}Al_{0.03}Ga_{0.95}N$ cladding layer 4 and the p-type $B_{0.02}Al_{0.03}Ga_{0.95}N$ cladding layer 9, respectively, n-type $Al_{0.04}Ga_{0.96}N$ optical guide layer and a p-type $Al_{0.04}Ga_{0.96}N$ optical guide layer instead of the n-type GaN optical guide layer 5 and the p-type GaN optical guide layer 8, respectively, and an active layer of a MQW structure having quantum layers of undoped $Ga_{0.98}In_{0.02}N$ instead of the active layer 6 of the MQW structure having the quantum well layers of undoped $Ga_{0.85}In_{0.15}N$. Band gap of the n-type $B_{0.03}Al_{0.03}Ga_{0.94}N$ cladding layer and the p-type $B_{0.03}Al_{0.03}Ga_{0.94}N$ cladding layer is 3.8 eV, band gap of the n-type $Al_{0.04}Ga_{0.96}N$ optical guide layer and the p-type $Al_{0.04}Ga_{0.96}N$ optical guide layer is 3.51 eV, and band gap of the $Ga_{0.98}In_{0.02}N$ quantum well layers in the active layer is 3.35 eV. In this case, emission wavelengths is about 370 nm in the ultraviolet range.

In the other respects, configuration of the GaN semiconductor laser according to the third embodiment is the same as the GaN semiconductor laser according to the first embodiment, and their explanation is omitted.

According to the third embodiment, the same advantages as the first to third advantages of the first embodiment can be obtained in the BAlGaN/AlGaN/GaInN SCH-structured GaN semiconductor laser capable of emitting light in the ultraviolet range.

Next explained is the fourth embodiment of the invention.

A GaN semiconductor laser taken as the fourth embodiment has a SCH structure including cladding layers of BAlGaN, optical guide layers of AlGaN and active layer of GaInN. The active layer has a MQW structure.

More specifically, in the GaN semiconductor layer according to the fourth embodiment, there are used an n-type $B_{0.05}Al_{0.03}Ga_{0.92}N$ cladding layer and a p-type $B_{0.05}Al_{0.03}Ga_{0.92}N$ cladding layer instead of the n-type $B_{0.02}Al_{0.03}Ga_{0.95}N$ cladding layer 4 and the p-type $B_{0.02}Al_{0.03}Ga_{0.95}N$ cladding layer 9, respectively, n-type $Al_{0.03}Ga_{0.97}N$ optical guide layer and a p-type $Al_{0.03}Ga_{0.97}N$ optical guide layer instead of the n-type GaN optical guide layer 5 and the p-type GaN optical guide layer 8, respectively, and an active layer of a MQW structure having quantum layers of undoped $Ga_{0.95}In_{0.05}N$ instead of the active layer 6 of the MQW structure having the quantum well layers of undoped $Ga_{0.85}In_{0.15}N$. Additionally, here are used an undoped GaN buffer layer, undoped GaN layer and p-type GaN contact layer in lieu of the undoped $B_{0.05}Ga_{0.95}N$ buffer layer 2, undoped $B_{0.05}Ga_{0.95}N$ layer 3 and p-type $B_{0.02}Ga_{0.98}N$ contact layer 10, respectively, and an n-type GaN contact layer doped with Si, for example, as the n-type impurity is interposed between the GaN layer and the n-type $B_{0.05}Al_{0.03}Ga_{0.92}N$ cladding layer. The n-side electrode 12 is located on the n-type GaN contact layer. Band gap of the n-type $B_{0.05}Al_{0.03}Ga_{0.92}N$ cladding layer and the p-type $B_{0.05}Al_{0.03}Ga_{0.92}N$ cladding layer is 4.0 eV, band gap of the n-type $Al_{0.03}Ga_{0.97}N$ optical guide layer and the p-type $Al_{0.03}Ga_{0.97}N$ optical guide layer is 3.48 eV, and band gap of the $Ga_{0.95}In_{0.05}N$ quantum well layers of the active layer is 3.28 eV. In this case, emission wavelength is about 380 nm in the ultraviolet range.

In the other respects, configuration of the GaN semiconductor laser according to the fourth embodiment is the same as the GaN semiconductor laser according to the first embodiment, and their explanation is omitted.

According to the fourth embodiment, the same advantage as the first advantage of the first embodiment can be obtained in the BAlGaN/AlGaN/GaInN SCH-structured GaN semiconductor laser capable of emitting light in the ultraviolet range.

Next explained is the fifth embodiment directed to a GaN semiconductor light emitting device which uses $B_pAl_q$-$Ga_rIn_sN$ (where $0<p\leq0.3$, $0\leq q<1$, $0<r<1$, $0\leq s<1$, p+q+r+s=1) as cladding layers, $B_aGa_bIn_cN$ (where $0\leq a\leq0.3$, $0<b\leq1$, $0\leq c<1$, a+b+c=1) as optical guide layers, and $B_xGa_yIn_zN$ (where $0\leq x\leq0.3$, $0\leq y<1$, $0<z\leq1$, X+y+z=1) as the active layer. A feature of this type lies in containing B in the cladding layers, thereby increasing their band gaps to reduce the threshold current density, and at the same time not containing Al in the active layer and optical guide layers to improve the resistance to oxidation and the optical damage level. By having the active layers and optical guide layers contain B, if necessary, their band gaps can be increased as well. A specific example is shown below and explained in detail.

Figure 8:
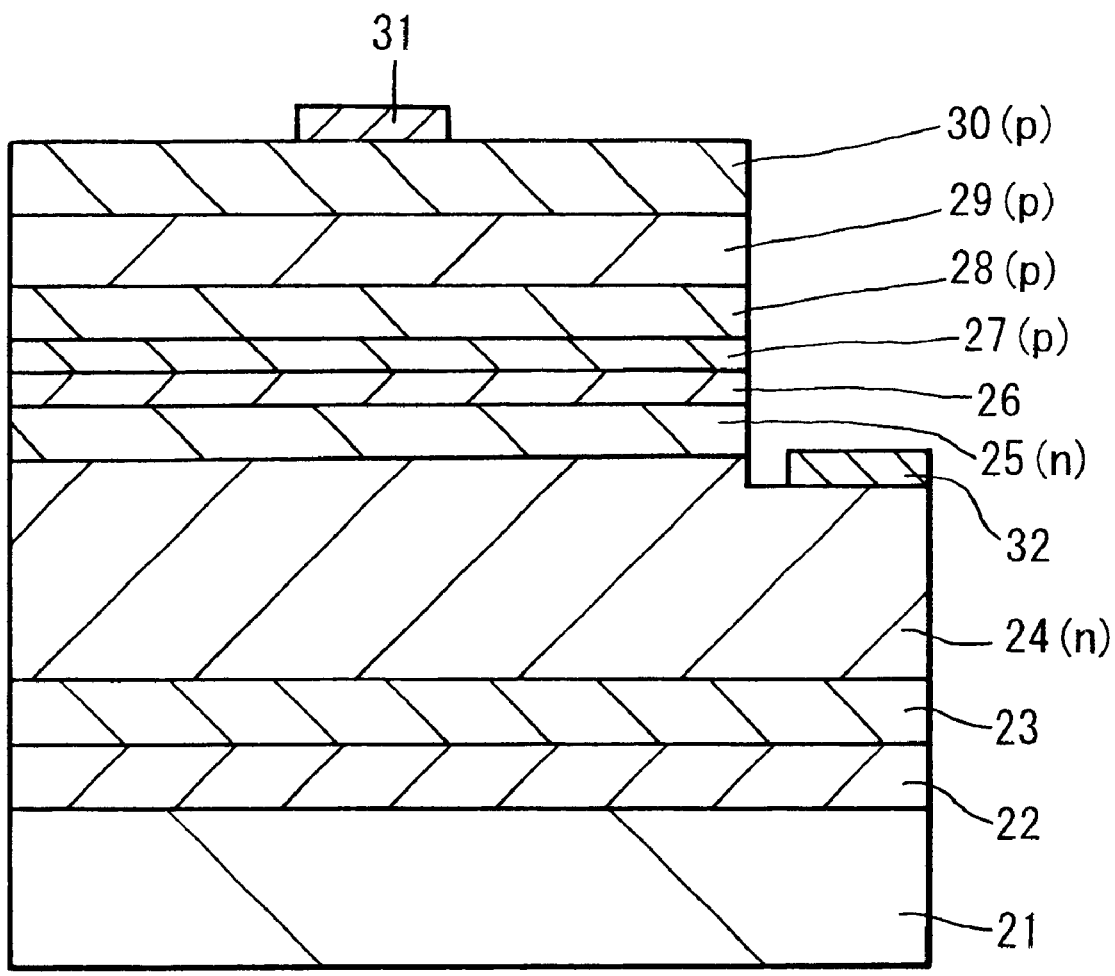
FIG. 8 is a cross-sectional view of a BAlGaN/BGaN/GaInN SCH-structured GaN semiconductor laser according to the fifth embodiment of the invention.

FIG. 8 is a cross-sectional view of a GaN semiconductor laser according to the fifth embodiment of the invention. The GaN semiconductor laser according to the fifth embodiment has a SCH structure using BAlGaN as its cladding layers, BGaN as the optical guide layers and GaInN as the active layer. The active layer has a MQW structure.

As shown in FIG. 8, in the GaN semiconductor laser according to the fifth embodiment, sequentially stacked on a c-plane sapphire substrate 21, for example, are, via an undoped $B_{0.05}Ga_{0.95}N$ buffer layer 22 by low-temperature growth: an undoped $B_{0.05}Ga_{0.95}N$ layer 23, n-type $B_{0.03}Al_{0.03}Ga_{0.94}N$ cladding layer 24, n-type $B_{0.01}Ga_{0.99}N$ optical guide layer 25, active layer 26 having a MQW structure including quantum well layers of undoped $Ga_{0.98}In_{0.02}N$, p-type $B_{0.1}Ga_{0.9}N$ cap layer 27, p-type $B_{0.01}Ga_{0.99}N$ optical guide layer 28, p-type $B_{0.03}Al_{0.03}Ga_{0.94}N$ cladding layer 29 and p-type $B_{0.02}Ga_{0.98}N$ contact layer 30.

The $B_{0.05}Ga_{0.95}N$ buffer layer 22 is 30 nm thick, for example. The $B_{0.05}Ga_{0.95}N$ layer 23 is 1 μm thick, for example. Band gaps of these $B_{0.05}Ga_{0.95}N$ buffer layer 22 and $B_{0.05}Ga_{0.95}N$ layer 23 are 3.96 eV.

The n-type $B_{0.03}Al_{0.03}Ga_{0.94}N$ cladding layer 24 is 3 μm thick, for example, and doped with Si, for example, as the n-type impurity. Band gap of this $B_{0.03}Al_{0.03}Ga_{0.94}N$ cladding layer 24 is 3.8 eV.

The n-type $B_{0.01}Ga_{0.99}N$ optical guide layer 25 is 100 nm thick, for example, and doped with Si, for example, as the n-type impurity. Band gap of this n-type $B_{0.01}Ga_{0.99}N$ optical guide layer 25 is 3.51 eV.

Each $Ga_{0.98}In_{0.02}N$ quantum well layer of the active layer 26 is 3.5 nm thick, for example. Band gap of the $Ga_{0.98}In_{0.02}N$ quantum well layers of the active layer 26 is 3.35 eV. In this case, emission wavelength is about 380 nm in the ultraviolet range.

The p-type $B_{0.1}Ga_{0.9}N$ cap layer 27 is 10 nm thick, for example, and doped with Mg, for example, as the p-type impurity. Band gap of this p-type $B_{0.1}Ga_{0.9}N$ cap layer 27 is 4.51 eV. The p-type $B_{0.1}Ga_{0.9}N$ cap layer 7 is more effective in preventing evaporation of In than conventional p-type AlGaN cap layer, and also has a higher p-type carrier concentration and a low resistance.

The p-type $B_{0.01}Ga_{0.99}N$ optical guide layer 28 is 100 nm thick, for example, and doped with Mg, for example, as the p-type impurity. Band gap of this p-type $B_{0.01}Ga_{0.99}N$ optical guide layer 28 is 3.51 eV.

The p-type $B_{0.03}Al_{0.03}Ga_{0.94}N$ cladding layer 29 is 1 μm thick, for example, and doped with Mg, for example, as the p-type impurity. Band gap of this p-type $B_{0.03}Al_{0.03}Ga_{0.94}N$ cladding layer 29 is 3.8 eV.

The p-type $B_{0.02}Ga_{0.98}N$ contact layer 30 is 100 nm thick, for example, and doped with Mg, for example, as the p-type impurity. Band gap of this p-type $B_{0.02}Ga_{0.98}N$ contact layer 30 is 3.62 eV.

Upper part of the n-type $B_{0.03}Al_{0.03}Ga_{0.94}N$ cladding layer 24, n-type $B_{0.01}Ga_{0.99}N$ optical guide layer 25, active layer 26, p-type $B_{0.1}Ga_{0.9}N$ cap layer 27, p-type $B_{0.01}Ga_{0.99}N$ optical guide layer 28, p-type $B_{0.03}Al_{0.03}Ga_{0.94}N$ cladding layer 29 and p-type $B_{0.02}Ga_{0.98}N$ contact layer 30 have the form of a stripe extending in one direction with a predetermined width.

A stripe-shaped p-side electrode 31 such as Ni/Pt/Au electrode or Ni/Au electrode, for example, is provided on the p-type $B_{0.02}Ga_{0.98}N$ contact layer 30. On the n-type $B_{0.03}Al_{0.03}Ga_{0.94}N$ cladding layer 24 in the region adjacent to the stripe portion, an n-side electrode 32 such as Ti/Al/Pt/Au electrode, for example, is provided.

In the other respects, configuration of the GaN semiconductor laser according to the fifth embodiment is the same as the GaN semiconductor laser according to the first embodiment, and their explanation is omitted.

According to the fifth embodiment, the same advantages as the first to third advantages of the first embodiment can be obtained in the BAlGaN/BGaN/GaInN SCH-structured GaN semiconductor laser capable of emitting blue-violet light.

Next explained is the sixth embodiment of the invention.

A GaN semiconductor laser taken as the sixth embodiment has a SCH structure including cladding layers of BAlGaN, optical guide layers of BGaN and active layer of BGaInN. The active layer has a MQW structure.

More specifically, in the GaN semiconductor layer according to the sixth embodiment, there are used an n-type $B_{0.02}Ga_{0.98}N$ optical guide layer and a p-type $B_{0.02}Ga_{0.98}N$ optical guide layer instead of the n-type $B_{0.01}Ga_{0.99}N$ optical guide layer 25 and the p-type $B_{0.01}Ga_{0.99}N$ optical guide layer 28, respectively, and an active layer of a MQW structure having quantum well layers of undoped $B_{0.01}Ga_{0.97}In_{0.02}N$ instead of the active layer of the MQW structure having quantum well layers of undoped $Ga_{0.98}In_{0.02}N$. Band gap of the n-type $B_{0.02}Ga_{0.98}N$ optical guide layer and the p-type $B_{0.02}Ga_{0.98}N$ optical guide layer is 3.62 eV, and band gap of the $B_{0.01}Ga_{0.97}In_{0.02}N$ quantum well layers of the active layer is 3.45 eV. In this case, emission wavelength is about 360 nm in the ultraviolet range.

In the other respects, configuration of the GaN semiconductor laser according to the sixth embodiment is the same as the GaN semiconductor laser according to the fifth embodiment, and their explanation is omitted.

According to the sixth embodiment, the same advantage as the fifth embodiment can be obtained in the BAlGaN/BGaN/BGaInN SCH-structured GaN semiconductor laser capable of emitting blue-violet light.

Next explained is the seventh embodiment directed to a GaN semiconductor light emitting device which uses $B_pAl_q$-$Ga_rN$ (where $0<p\leq0.3$, $0\leq q<1$, $0<r<1$, p+q+r=1) as cladding layers, $B_aAl_bGa_cN$ (where $0\leq a\leq0.3$, $0<b\leq1$, $0\leq c<1$, a+b+c=1) as optical guide layers, and $B_xAl_yGa_zN$ (where $0\leq x\leq0.3$, $0\leq y<1$, $0<z\leq1$, x+y+z=1) as the active layer. A feature of this type lies in containing B in the cladding layers, thereby increasing their band gaps to reduce the threshold current density, and at the same time not containing In in the active layer, optical guide layers and cladding layers to enable these layers to be grown at 1000° C. or higher. By having the active layers and optical guide layers contain B and/or Al, if necessary, their band gaps can be increased as well, and emission wavelength can be shortened as low as never realized before. A specific example is shown below and explained in detail.

Figure 9:
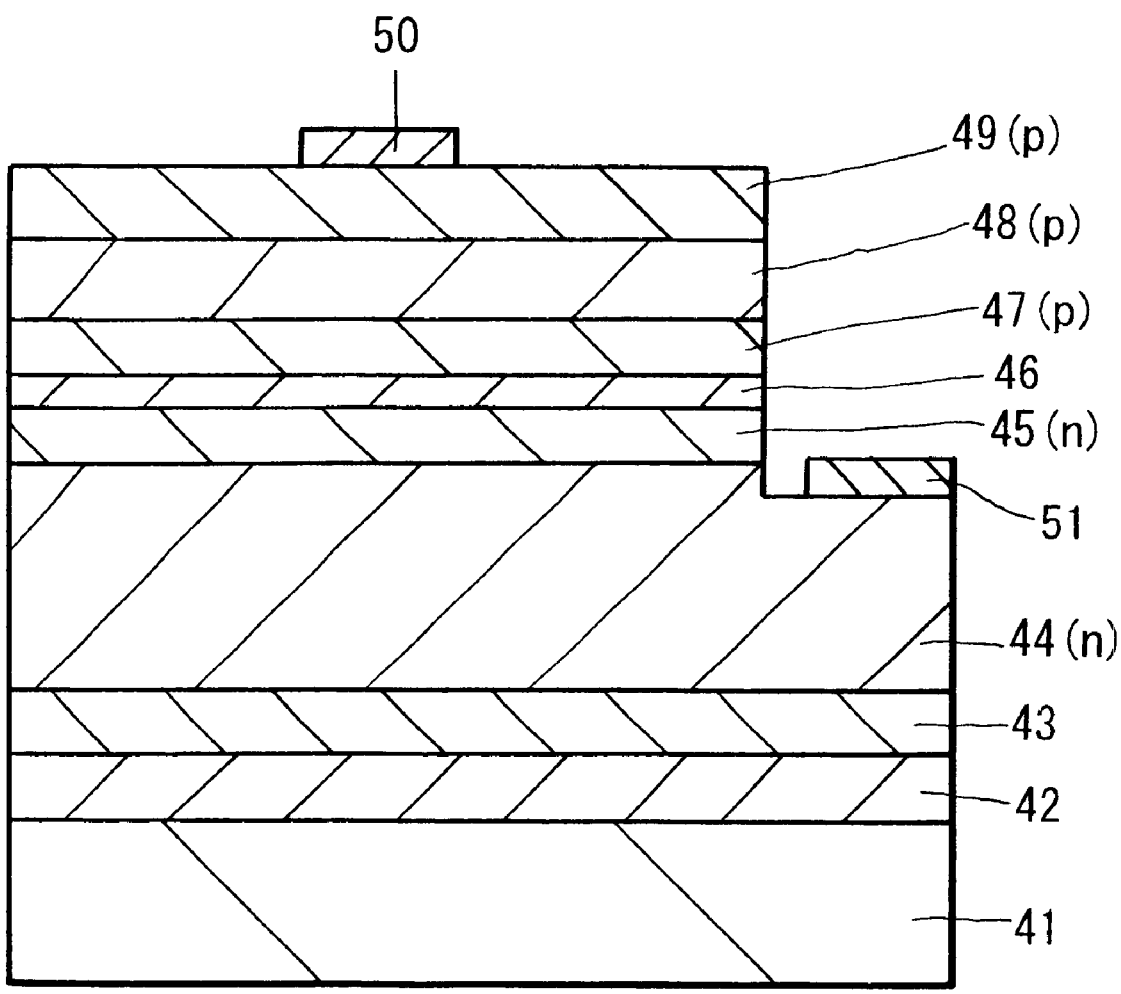
FIG. 9 is a cross-sectional view of a BAlGaN/AlGaN/AlGaN SCH-structured GaN semiconductor laser according to the seventh embodiment of the invention.

FIG. 9 is a cross-sectional view of a GaN semiconductor laser according to the seventh embodiment of the invention. The GaN semiconductor laser according to the seventh embodiment has a SCH structure using BAlGaN as its cladding layers, BAlGaN as the optical guide layers and AlGaN as the active layer. The active layer has a MQW structure.

As shown in FIG. 9, in the GaN semiconductor laser according to the seventh embodiment, sequentially stacked on a c-plane sapphire substrate 41, for example, are, via an undoped $B_{0.05}Ga_{0.95}N$ buffer layer 42 by low-temperature growth: an undoped $B_{0.05}Ga_{0.95}N$ layer 43, n-type $B_{0.05}Al_{0.07}Ga_{0.88}N$ cladding layer 44, n-type $B_{0.02}Al_{0.07}Ga_{0.91}N$ optical guide layer 45, active layer 46 having a MQW structure including quantum well layers of undoped $Al_{0.15}Ga_{0.85}N$ and barrier layers of undoped $Al_{0.07}Ga_{0.93}N$, p-type $B_{0.02}Al_{0.07}Ga_{0.91}N$ optical guide layer 47, p-type $B_{0.05}Al_{0.07}Ga_{0.88}N$ cladding layer 48 and p-type $B_{0.05}Ga_{0.95}N$ contact layer 49. In the GaN semiconductor laser according to the seventh embodiment, since the active layer 46 does not contain In, the cap layer for the purpose of preventing evaporation of In need not be provided near the active layer 46.

The $B_{0.05}Ga_{0.95}N$ buffer layer 42 is 30 nm thick, for example. The $B_{0.05}Ga_{0.95}N$ layer 43 is 1 μm thick, for example. Band gaps of these $B_{0.05}Ga_{0.95}N$ buffer layer 42 and $B_{0.05}Ga_{0.95}N$ layer 43 are 3.96 eV.

The n-type $B_{0.05}Al_{0.07}Ga_{0.88}N$ cladding layer 44 is 3 μm thick, for example, and doped with Si, for example, as the n-type impurity. Band gap of this $B_{0.05}Al_{0.07}Ga_{0.88}N$ cladding layer 44 is 4.15 eV.

The n-type $B_{0.02}Al_{0.07}Ga_{0.91}N$ optical guide layer 45 is 100 nm thick, for example, and doped with Si, for example, as the n-type impurity. Band gap of this n-type $B_{0.02}Al_{0.07}Ga_{0.91}N$ optical guide layer 45 is 3.87 eV.

Each $Al_{0.15}Ga_{0.85}N$ quantum well layer of the active layer 46 is 3.5 nm thick, for example, and each $Al_{0.07}Ga_{0.93}N$ barrier layer is 6 nm thick, for example. Band gap of the $Al_{0.15}Ga_{0.85}N$ quantum well layers of the active layer 46 is 3.60 eV, and band gap of the $Al_{0.07}Ga_{0.93}N$ barrier layers is 3.82 eV. In this case, emission wavelength is about 325 nm in the ultraviolet range.

The p-type $B_{0.020}Al_{0.07}Ga_{0.91}N$ optical guide layer 47 is 100 nm thick, for example, and doped with Mg, for example, as the p-type impurity. Band gap of this p-type $B_{0.02}Al_{0.07}Ga_{0.91}N$ optical guide layer 47 is 3.87 eV.

The p-type $B_{0.05}Al_{0.07}Ga_{0.88}N$ cladding layer 48 is 1 μm thick, for example, and doped with Mg, for example, as the p-type impurity. Band gap of this p-type $B_{0.05}Al_{0.07}Ga_{0.88}N$ cladding layer 48 is 4.15 eV.

The p-type $B_{0.05}Ga_{0.95}N$ contact layer 49 is 100 nm thick, for example, and doped with Mg, for example, as the p-type impurity. Band gap of this p-type $B_{0.05}Ga_{0.95}N$ contact layer 49 is 3.96 eV.

Upper part of the n-type $B_{0.05}Al_{0.07}Ga_{0.88}N$ cladding layer 44, n-type $B_{0.02}Al_{0.91}N$ optical guide layer 45, active layer 46, p-type $B_{0.02}Al_{0.07}Ga_{0.91}N$ optical guide layer 47, p-type $B_{0.05}Al_{0.07}Ga_{0.88}N$ cladding layer 48 and p-type $B_{0.05}Ga_{0.95}N$ contact layer 49 have the form of a stripe extending in one direction with a predetermined width.

A stripe-shaped p-side electrode 50 such as Ni/Pt/Au electrode or Ni/Au electrode, for example, is provided on the p-type $B_{0.05}Ga_{0.95}N$ contact layer 49. On the n-type $B_{0.05}Al_{0.07}Ga_{0.88}N$ cladding layer 44 in the region adjacent to the stripe portion, an n-side electrode 51 such as Ti/Al/Pt/Au electrode, for example, is provided.

Next explained is a manufacturing method of the GaN semiconductor laser according to the seventh embodiment.

For manufacturing the GaN semiconductor laser according to the seventh embodiment, first of all, the sapphire substrate 41 is heated to 1050° C., for example, for thermal cleaning of its surface. After that, while maintaining the surface of the sapphire substrate 41 clean, the $B_{0.05}Ga_{0.95}N$ buffer layer 42 is grown thereon by low-temperature growth setting the temperature at 500° C., for example, by MOCVD. Subsequently, sequentially stacked by MOCVD on the $B_{0.05}Ga_{0.95}N$ buffer layer 42 are: the $B_{0.05}Ga_{0.95}N$ layer 43, n-type $B_{0.05}Al_{0.07}Ga_{0.88}N$ cladding layer 44, n-type $B_{0.02}Al_{0.07}Ga_{0.91}N$ optical guide layer 45, active layer 46 having a MQW structure including quantum well layers of undoped $Al_{0.15}Ga_{0.85}N$ and barrier layers of undoped $Al_{0.07}Ga_{0.93}N$, p-type $B_{0.02}Al_{0.07}Ga_{0.91}N$ optical guide layer 47, p-type $B_{0.05}Al_{0.07}Ga_{0.88}N$ cladding layer 48 and p-type $B_{0.05}Ga_{0.95}N$ contact layer 49. In the GaN semiconductor laser according to the seventh embodiment, since the active layer 46 does not contain In, all of the semiconductor layers forming the laser structure can be grown at 1000° C. or higher temperatures. In the example shown here, growth temperatures of the $B_{0.05}Ga_{0.95}N$ layer 43, n-type $B_{0.05}Al_{0.07}Ga_{0.88}N$ cladding layer 44, n-type $B_{0.02}Al_{0.07}Ga_{0.91}N$ optical guide layer 45, active layer 46, p-type $B_{0.02}Al_{0.07}Ga_{0.91}N$ optical guide layer 47, p-type $B_{0.05}Al_{0.07}Ga_{0.88}N$ cladding layer 48 and p-type $B_{0.05}N$ contact layer 49 are held at about 1000° C.

After that, by forwarding the same process as the manufacturing method of the GaN semiconductor laser according to the first embodiment, the intended SCH-structured GaN semiconductor laser is completed as shown in FIG. 9.

The seventh embodiment having the above-explained configuration ensures the same advantages as the first and second advantages of the first embodiment in the BAlGaN/BAlGaN/AlGaN SCH-structured GaN semiconductor laser capable of emitting light in the ultraviolet region, and provides an additional advantage explained below.

That is, according to the seventh embodiment, since the active layer 46 does not contain In, all of the layers involving the active layer 46 can be grown at 1000° C. or higher temperatures. Therefore, it is possible to improve the crystallographic property of GaN semiconductor layers forming the laser structure and therefore obtain a GaN semiconductor laser having a very good optical property.

Next explained is the eighth embodiment of the invention. A GaN semiconductor laser taken as the eighth embodiment has a SCH structure including cladding layers of BAlGaN, optical guide layers of AlGaN and active layer of BGaN. The active layer has a MQW structure.

More specifically, in the GaN semiconductor layer according to the eighth embodiment, there are used an n-type $Al_{0.07}Ga_{0.93}N$ optical guide layer and a p-type $Al_{0.07}Ga_{0.93}N$ optical guide layer instead of the n-type $B_{0.02}Al_{0.07}Ga_{0.91}N$ optical guide layer 45 and the p-type $B_{0.02}Al_{0.07}Ga_{0.91}N$ optical guide layer 47, respectively, and an active layer of a MQW structure having quantum layers of undoped $B_{0.01}Ga_{0.99}N$ instead of the active layer 46 of the MQW structure having the quantum well layers of undoped $Al_{0.15}Ga_{0.85}N$. Since this $B_{0.01}Ga_{0.99}N$ quantum well layers of the active layer do not contain Al, it is not oxidized easily, and also has a strength against optical damage. There are further used an undoped GaN buffer layer, undoped GaN layer and p-type GaN contact layer. instead of the $B_{0.05}Ga_{0.95}N$ buffer layer 42, $B_{0.05}Ga_{0.95}N$ layer 43 and p-type $B_{0.05}Ga_{0.95}N$ contact layer 49, respectively.

Additionally, an n-type GaN contact layer doped with Si, for example, as the n-type impurity is interposed between the GaN layer and the n-type $B_{0.05}Al_{0.07}Ga_{0.98}N$ cladding layer 44. The n-side electrode 51 is provided on the n-type GaN contact layer. Band gap of the n-type $Al_{0.07}Ga_{0.93}N$ optical guide layer and the p-type $Al_{0.07}Ga_{0.93}N$ optical guide layer is 3.60 eV. Band gap of the $B_{0.01}Ga_{0.98}N$ quantum well layers of the active layer is 3.51 eV. In this case, emission wavelength is about 350 nm in the ultraviolet range.

In the other respects, configuration of the GaN semiconductor laser according to the eighth embodiment is the same as the GaN semiconductor laser according to the seventh embodiment, and their explanation is omitted.

According to the eighth embodiment, the same advantages as the first to third advantages of those of the seventh embodiment can be obtained in the BAlGaN/AlGaN/BGaN SCH-structured GaN semiconductor laser capable of emitting light in the ultraviolet region.

Next explained is the ninth embodiment of the invention. A GaN semiconductor laser taken as the ninth embodiment has a SCH structure including cladding layers of BAlGaN, optical guide layers of AlGaN and active layer of GaN. The active layer has a MQW structure.

More specifically, in the GaN semiconductor laser according to the ninth embodiment, there are used an n-type $Al_{0.07}Ga_{0.93}N$ optical guide layer and a p-type $Al_{0.07}Ga_{0.93}N$ optical guide layer instead of the n-type $B_{0.02}Al_{0.07}Ga_{0.91}N$ optical guide layer 45 and the p-type $B_{0.02}Al_{0.07}Ga_{0.91}N$ optical guide layer 47, respectively, and an active layer of a MQW structure having quantum layers of undoped GaN instead of the active layer 46 of the MQW structure having the quantum well layers of undoped $Al_{0.15}Ga_{0.85}N$. Since this GaN quantum well layers of the active layer do not contain Al, it is not oxidized easily, and also has a strength against optical damage. There are further used an undoped GaN buffer layer, undoped GaN layer and p-type GaN contact layer instead of the $B_{0.05}Ga_{0.95}N$ buffer layer 42, $B_{0.05}Ga_{0.95}N$ layer 43 and p-type $B_{0.05}Ga_{0.95}N$ contact layer 49, respectively. Additionally, an n-type GaN contact layer doped with Si, for example, as the n-type impurity is interposed between the GaN layer and the n-type $B_{0.05}Al_{0.07}Ga_{0.88}N$ cladding layer 44. The n-side electrode 51 is provided on the n-type GaN contact layer. Band gap of the n-type $Al_{0.07}Ga_{0.93}N$ optical guide layer and the p-type $Al_{0.07}Ga_{0.93}N$ optical guide layer is 3.60 eV. Band gap of the GaN quantum well layers of the active layer is 3.4 eV. In this case, emission wavelength is about 360 nm in the ultraviolet range.

In the other respects, configuration of the GaN semiconductor laser according to the ninth embodiment is the same as the GaN semiconductor laser according to the seventh embodiment, and their explanation is omitted.

According to the ninth embodiment, the same advantages as the first to third advantages of those of the seventh embodiment can be obtained in the BAlGaN/AlGaN/GaN SCH-structured GaN semiconductor laser capable of emitting light in the ultraviolet region.

Figure 10A:
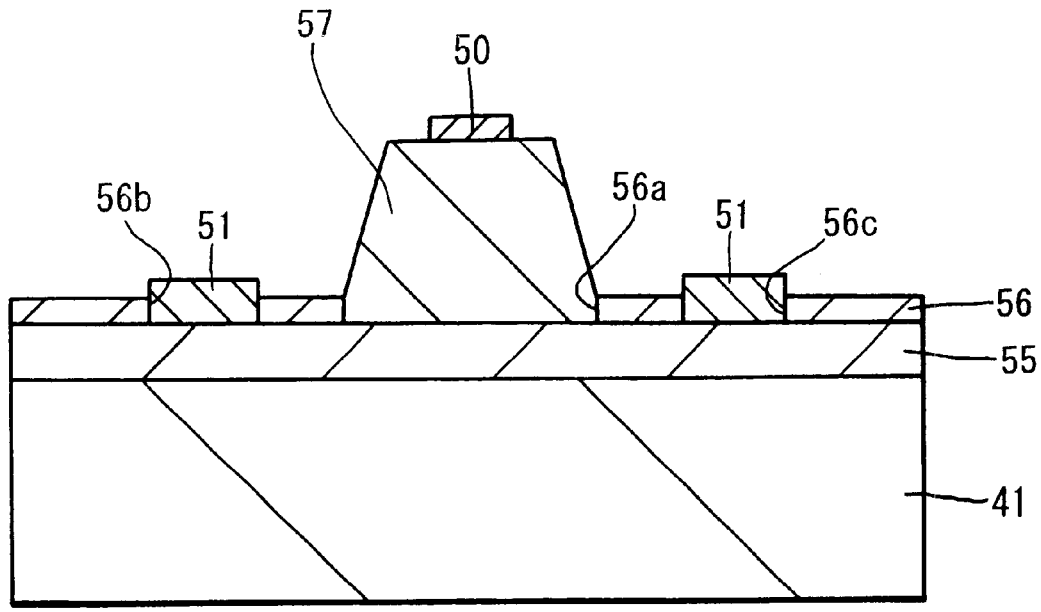
FIGS. 10A and 10B are cross-sectional views of a BAlGaN/AlGaN/AlGaN SCH-structured GaN semiconductor laser according to the tenth embodiment of the invention.
Figure 10B:
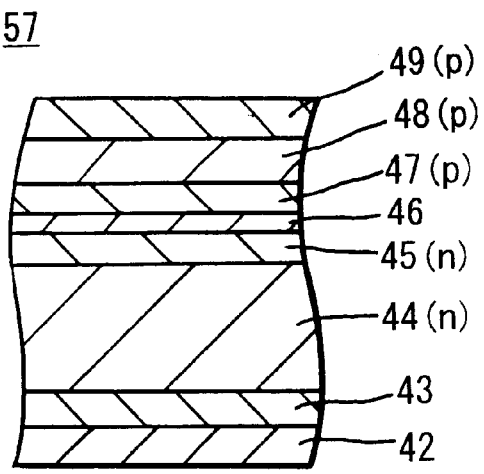

Next explained is the tenth embodiment of the invention. FIGS. 10A and 10B are cross-sectional views of a BAlGaN/AlGaN/AlGaN SCH-structured GaN semiconductor laser according to the tenth embodiment. The GaN semiconductor laser according to the tenth embodiment is configured to alleviate distortion of the layers containing B by selectively growing the same laser structure as the GaN semiconductor laser according to the seventh embodiment on a substrate by using a growth mask.

As shown in FIGS. 10A and 10B, in the GaN semiconductor laser according to the tenth embodiment, an -type GaN layer 55 is formed on the sapphire substrate 41. The n-type GaN layer 55 is 5 μm thick, for example, and doped with Si, for example, as the n-type impurity. Formed on the n-type GaN layer 55 is a $SiO_2$ film 56. A TEOS film or SIN film may be used instead of the $SiO_2$ film 56. The $SiO_2$ film 56 has an aperture 56a in a predetermined portion to define the growth region. Size of the aperture 56a is determined not to produce cracks in a GaN semiconductor layer 57 stacked therein to form a laser structure. More specifically, the aperture 56a has the size of 1 mm×20 μm, for example. The GaN semiconductor layer 57 forming the laser structure has the same multi-layered structure as the laser structure in the GaN semiconductor laser according to the seventh embodiment. In the tenth embodiment, however, the GaN semiconductor layers 57 forming the laser structure are made by selective growth on the n-type GaN layer 55 exposed in the aperture 56a, using the $SiO_2$ film 56 as a mask, and has a trapezoidal cross-sectional configuration.

The p-side electrode 50 is in contact with the p-type $B_{0.02}Al_{0.07}Ga_{0.91}N$ optical guide layer 47 on the top of the GaN semiconductor layers 57. The n-side electrodes 51 are in contact with the n-type GaN layer 55 through apertures 56b and 56c formed in the $SiO_2$ film 56 at opposite sides of the aperture 56a.

Next explained is a manufacturing method of the GaN semiconductor laser according to the tenth embodiment.

In the manufacturing method of the GaN semiconductor laser according to the tenth embodiment, first grown on the sapphire substrate 41 is the n-type GaN layer 55 by MOCVD. The n-type GaN layer 55 is preferably grown on the sapphire substrate 41 via a buffer layer.

After that, the $SiO_2$ film 56 is formed on the n-type GaN layer 55 by CVD. Then, by lithography and etching, the aperture 56a for regulating the growth region is made in a predetermined location of the $SiO_2$ film 56.

Thereafter, the GaN semiconductor layers 57, namely, from the $B_{0.05}Ga_{0.95}N$ buffer layer 42 to the p-type $B_{0.05}Ga_{0.95}N$ contact layer 49, are selectively grown on the n-type GaN layer 55 exposed in the aperture 56a.

More specifically, the structured substrate prepared through the foregoing steps is heated to 1050° C., for example, for thermal cleaning of its surface. After that, while maintaining the surface of the structured substrate clean, the undoped $B_{0.05}Ga_{0.95}N$ buffer layer 42 is grown on the n-type GaN layer 55 in the aperture 56a by low-temperature growth setting the temperature at 500° C., for example, by MOCVD. Subsequently, setting the growth temperature at 1000° C., for example, sequentially stacked by MOCVD on the $B_{0.05}Ga_{0.95}N$ buffer layer 42 are: the $B_{0.05}Ga_{0.95}N$ layer 43, n-type $B_{0.05}Al_{0.07}Ga_{0.88}N$ cladding layer 44, n-type $B_{0.02}Al_{0.07}Ga_{0.91}N$ optical guide layer 45, active layer 46, p-type $B_{0.02}Al_{0.07}Ga_{0.91}N$ optical guide layer 47, p-type $B_{0.05}Al_{0.07}Ga_{0.88}N$ cladding layer 48 and p-type $B_{0.05}Ga_{0.95}N$ contact layer 49. In this process, by annealing or by using MEE (migration enhanced epitaxy) as the growth technique, the GaN semiconductor layers 57 are prevented from growing on the $SiO_2$ film 56, and by adjusting the growth conditions, the GaN semiconductor layers 57 are prevented from growing on the facets. As a result, the GaN semiconductor layers 57 grow in a trapezoidal form on the n-type GaN layer 55 in the aperture 56a.

Then, the p-side electrode 50 is formed on the p-type $B_{0.05}Ga_{0.95}N$ contact layer 49 on the top of the GaN semiconductor layers 57. Additionally, the apertures 56b and 56c are formed in predetermined locations of the SiO$_2$ film 56, and n-side electrodes 51 are made on the n-type GaN layer 55 exposed in these apertures 56b and 56c. After that, through formation of cavity edges and division into chips, the intended SCH-structured GaN semiconductor laser is completed as shown in FIG. 10.

According to the tenth embodiment, since the GaN semiconductor layer 57 forming the laser structure are selectively grown in a relatively small sectioned growth region, and their growth areas become smaller and smaller as the GaN semiconductor layers be apart from the substrate, the stress that layers containing B among these GaN semiconductor layers 57 suffer can be reduced. As a result, cracks in the GaN semiconductor layers 57 can be prevented. Therefore, this embodiment has the additional advantage, namely, further improvement of the optical property of the GaN semiconductor layers 57.

Figure 11:
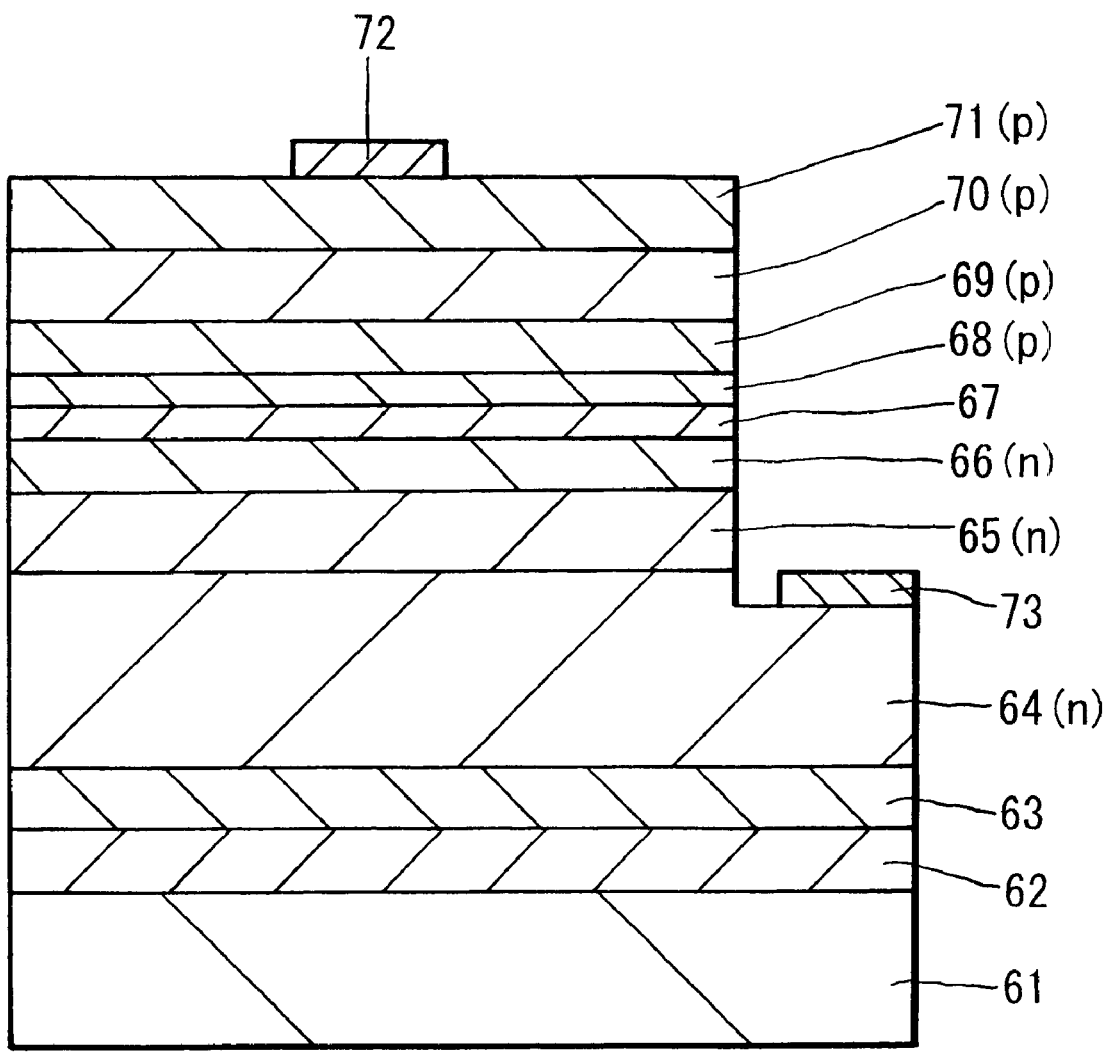
FIG. 11 is a cross-sectional view of a AlGaN/GaN/GaInN SCH-structured GaN semiconductor laser according to the eleventh embodiment of the invention.

Next explained is the eleventh embodiment of the invention. FIG. 11 is a cross-sectional view of a BAlGaN/AlGaN/AlGaN SCH-structured GaN semiconductor laser according to the eleventh embodiment. The GaN semiconductor laser according to the eleventh embodiment has a SCH structure using AlGaN as the cladding layers, GaN as the optical guide layers and GaInN as the active layer. The active layer has a MQW structure.

As shown in FIG. 11, in the GaN semiconductor laser according to the eleventh embodiment, sequentially stacked on a c-plane sapphire substrate 61, for example, are, via an undoped GaN buffer layer 62 by low-temperature growth: an undoped GaN layer 63, n-type GaN contact layer 64, n-type Al$_{0.07}$Ga$_{0.93}$N cladding layer 65, n-type GaN optical guide layer 66, active layer 67 having a MQW structure including quantum well layers of undoped Ga$_{0.9}$In$_{0.1}$N and barrier layers of undoped Ga$_{0.99}$In$_{0.01}$N, p-type B$_{0.1}$Ga$_{0.9}$N cap layer 68, p-type GaN optical guide layer 69, p-type Al$_{0.07}$Ga$_{0.93}$N cladding layer 70 and p-type GaN contact layer 71.

The GaN buffer layer 62 is 30 nm thick, for example. The GaN layer 63 is 1 $\mu$m thick, for example. Band gaps of these GaN buffer layer 62 and GaN layer 63 are 3.4 eV.

The n-type GaN contact layer 64 is 5 $\mu$m thick, for example, and doped with Si, for example, as the n-type impurity. Band gap of this n-type GaN contact layer 64 is 3.4 eV.

The n-type Al$_{0.07}$Ga$_{0.93}$N cladding layer 65 is 1 $\mu$m thick, for example, and doped with Si, for example, as the n-type impurity. Band gap of this n-type Al$_{0.07}$Ga$_{0.93}$N cladding layer 65 is 3.65 eV.

The n-type GaN optical guide layer 66 is 100 nm thick, for example, and doped with Si, for example, as the n-type impurity. Band gap of this n-type GaN optical guide layer 66 is 3.4 eV.

Each Ga$_{0.9}$In$_{0.1}$N quantum well layer of the active layer 67 is 3.5 nm thick, for example. Band gap of the Ga$_{0.9}$In$_{0.1}$N quantum well layers of the active layer 67 is 3.15 eV. In this case, emission wavelength is about 400 nm, and blue-violet light can be emitted.

The p-type B$_{0.1}$Ga$_{0.9}$N cap layer 68 is 10 nm thick, for example, and doped with Mg, for example, as the p-type impurity. Band gap of this p-type B$_{0.1}$Ga$_{0.9}$N cap layer 68 is 4.51 eV. The p-type B$_{0.1}$Ga$_{0.9}$N cap layer 68 is the same as the p-type B$_{0.1}$Ga$_{0.9}$N cap layers 7, 27 in the first to sixth embodiments.

The p-type GaN optical guide layer 69 is 100 nm thick, for example, and doped with Mg, for example, as the p-type impurity. Band gap of this p-type GaN optical guide layer 69 is 3.4 eV.

The p-type Al$_{0.07}$Ga$_{0.93}$N cladding layer 70 is 1 $\mu$m thick, for example, and doped with Mg, for example, as the p-type impurity. Band gap of this p-type Al$_{0.07}$Ga$_{0.93}$N cladding layer 70 is 3.65 eV.

The p-type GaN contact layer 71 is 100 nm thick, for example, and doped with Mg, for example, as the p-type impurity. Band gap of this p-type GaN contact layer 71 is 3.4 eV.

Upper part of the n-type GaN contact layer 64, n-type Al$_{0.07}$Ga$_{0.93}$N cladding layer 65, n-type GaN optical guide layer 66, active layer 67, p-type B$_{0.1}$Ga$_{0.9}$N cap layer 68, p-type GaN optical guide layer 69, p-type Al$_{0.07}$Ga$_{0.93}$N cladding layer 70 and p-type GaN contact layer 71 have the form of a stripe extending in one direction with a predetermined width.

A stripe-shaped p-side electrode 72 such as Ni/Pt/Au electrode or Ni/Au electrode, for example, is provided on the p-type GaN contact layer 71. On the n-type GaN contact layer 64 in the region adjacent to the stripe portion, an n-side electrode 73 such as Ti/Al/Pt/Au electrode, for example, is provided.

The method for manufacturing the GaN semiconductor laser according to the eleventh embodiment is the same as the manufacturing method of the GaN semiconductor laser according to the first embodiment. So, its explanation is omitted.

According to the eleventh embodiment, by using the cap layer made of BGaN in lieu of an AlGaN cap layer in an AlGaN/GaN/GaInN SCH-structured GaN semiconductor laser having the same configuration as a conventional structure, the same advantage as the third advantage of the first embodiment can be obtained.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures, source materials and processes proposed in the first to eleventh embodiments are mere examples, and other numerical values, structures, source materials and processes may be used, if necessary. For example, in the tenth embodiment, the same laser structure as the GaN semiconductor laser according to the seventh embodiment is selectively grown on the substrate, and distortion of layers containing B is reduced. However, using the same technique, GaN semiconductor lasers according to the first to sixth, eighth, ninth and eleventh embodiment may be manufactured.

Further, although the first to eleventh embodiments have been explained as applying the invention to SCH-structured GaN semiconductor lasers, the present invention is also applicable, needless to say, to GaN semiconductor lasers with a DH (double heterostructure) structure and further to GaN light emitting diodes (LED). The active layer may have a single quantum well (SQW) structure.

Furthermore, although the first to eleventh embodiments have been explained as applying the invention to semiconductor light emitting elements using nitride III–V compound semiconductors, the present invention is also applicable to semiconductor devices using nitride III–V compound semiconductors. In particular, by applying the invention to carrier transit devices such as FET, and photodetectors such as photo diodes, high band gap carrier transit devices and photodetectors excellent in electric property and optical property can be realized.

As explained above, according to the first aspect of the invention, by introducing According to the first aspect of the invention, by introducing B into desired layers among a plurality of semiconductor layers within a range making a direct transition type, it is possible to increase its band gap, increase its p-type carrier concentration, and so on, while realizing a good optical property in the layer. Therefore, the invention can provide a semiconductor device using III–V compound semiconductors excellent in electric property and optical property and having a high band gap.

According to the second aspect of the invention, by introducing B into desired layers, in particular cladding layers, among a plurality of semiconductor layers forming a light emitting structure, within a range making a direct transition type, it is possible to increase its band gap, increase its p-type carrier concentration, and so on, while realizing a good optical property in the layer. Therefore, the invention can provide a semiconductor light emitting device using III–V compound semiconductors having the performance and quality high enough to emit light even in the ultraviolet range.

What is claimed is:

1. A semiconductor device having a plurality of semiconductor layers made of nitride III–V compound semiconductors, comprising:
said plurality of semiconductor layers including at least one layer made of a nitride III–V compound semiconductor containing boron (B) that is not greater than 30% by atomic weight in the nitride layer; and a band gap difference between a cladding layer and an active layer is at least 500 meV.

2. The semiconductor device according to claim 1 wherein said layer made of the nitride III–V compound semiconductor containing B is made of $B_pAl_qGa_rIn_sN$ (where $0<p \leq 0.3$, $0 \leq q<1$, $0<r<1$, $0 \leq s<1$, and $p+q+r+s=1$).

3. The semiconductor device according to claim 1 wherein said plurality of semiconductor layers are made by making a mask having an aperture on a substrate and selectively growing said nitride III–V compound semiconductors on said substrate exposed in said aperture.

4. The semiconductor device according to claim 1 wherein said plurality of semiconductor layers are made by making a mesa portion on a major surface of a substrate, and selectively growing said nitride III–V compound semiconductors on said mesa portion.

5. A semiconductor light emitting device having a light emitting structure composed of a plurality of semiconductor layers which are made of nitride III–V compound semiconductors, comprising:
said plurality of semiconductor layers, which constitutes said light emitting structure, including at least one layer made of a nitride III–V compound semiconductor containing boron (B) that is not greater than 30% by atomic weight in the nitride layer; and a band gap difference between a cladding layer and an active layer is at least 500 meV.

6. The semiconductor light emitting device according to claim 5 wherein said layer made of the nitride III–V compound semiconductor containing B is made of $B_pAl_qGa_rIn_sN$ (where $0<p \leq 0.3$, $0 \leq q<1$, $0<r<1$, $0 \leq s<1$, and $p+q+r+s=1$).

7. The semiconductor light emitting device according to claim 5 wherein said plurality of semiconductor layers constituting said light emitting structure are made by making a mask having an aperture on a substrate and selectively growing said nitride III–V compound semiconductors on said substrate exposed in said aperture.

8. The semiconductor light emitting device according to claim 5 wherein said plurality of semiconductor layers constituting said light emitting structure are made by making a mesa portion on a major surface of a substrate, and selectively growing said nitride III–V compound semiconductors on said mesa portion.

9. The semiconductor light emitting device according to claim 5 wherein said light emitting structure has a structure interposing an active layer between a first cladding layer and a second cladding layer, said first cladding layer and said second cladding layer being made of $B_pAl_qGa_rIn_sN$ (where $0<p \leq 0.3$, $0 \leq q<1$, $0<r<1$, $0 \leq s<1$, and $p+q+r+s=1$) and said active layer being made of $Al_xGa_yIn_zN$ (where $0 \leq x<1$, $0 \leq y<1$, $0<z \leq 1$ and $x+y+z=1$).

10. The semiconductor light emitting device according to claim 9 wherein said first cladding layer and said second cladding layer are made of $B_pAl_qGa_rN$ (where $0<p \leq 0.3$, $0 \leq q<1$, $0<r<1$, and $p+q+r=1$).

11. The semiconductor light emitting device according to claim 9 wherein said light emitting structure further includes a first optical guide layer and a second optical guide layer between said first cladding layer and said active layer, and between said active layer and said second cladding layer, respectively, and said first optical guide layer and said second optical guide layer are made of $Al_aGa_bIn_cN$ (where $0 \leq a<1$, $0<b \leq 1$, $0 \leq c<1$, and $a+b+c=1$).

12. The semiconductor light emitting device according to claim 11 wherein said first optical guide layer and said second optical guide layer are made of $Al_aGa_bN$ (where $0 \leq a<1$, $0<b \leq 1$, and $a+b=1$).

13. The semiconductor light emitting device according to claim 9 wherein difference between the band gap of said first cladding layer and said second cladding layer and the band gap of said active layer is not less than 500 meV.

14. The semiconductor light emitting device according to claim 9 wherein composition of Al in said first cladding layer and said second cladding layer is not higher than 0.1, and composition of B therein is not higher than 0.1.

15. The semiconductor light emitting device according to claim 5 wherein said light emitting structure has a structure interposing an active layer between a first cladding layer and a second cladding layer, said first cladding layer and said second cladding layer being made of $B_pAl_qGa_rIn_sN$ (where $0<p \leq 0.3$, $0 \leq q<1$, $0<r<1$, $0s<1$, and $p+q+r+s=1$) and said active layer being made of $B_xGa_yIn_zN$ (where $0 \leq x \leq 0.3$, $0 \leq y<1$, $0<z<1$ and $x+y+z=1$).

16. The semiconductor light emitting device according to claim 15 wherein said first cladding layer and said second cladding layer are made of $B_pAl_qGa_rN$ (where $0<p \leq 0.3$, $0 \leq q<1$, $0<r<1$, and $p+q+r=1$).

17. The semiconductor light emitting device according to claim 15 wherein said light emitting structure further includes a first optical guide layer and a second optical guide layer between said first cladding layer and said active layer, and between said active layer and said second cladding layer, respectively, and said first optical guide layer and said second optical guide layer are made of $B_aGa_bIn_cN$ (where $0 \leq a \leq 0.3$, $0<b \leq 1$, $0 \leq c<1$, and $a+b+c=1$).

18. The semiconductor light emitting device according to claim 17 wherein said first optical guide layer and said second optical guide layer are made of $B_aGa_bN$ (where $0 \leq a \leq 0.3$, $0.7<b \leq 1$, and $a+b=1$).

19. The semiconductor light emitting device according to claim 15 wherein difference between the band gap of said first cladding layer and said second cladding layer and the band gap of said active layer is not less than 500 meV.

20. The semiconductor light emitting device according to claim 15 wherein composition of Al in said first cladding layer and said second cladding layer is not higher than 0.1, and composition of B therein is not higher than 0.1.

21. The semiconductor light emitting device according to claim 5 wherein said light emitting structure has a structure interposing an active layer between a first cladding layer and a second cladding layer, said first cladding layer and said second cladding layer being made of $B_p Al_q Ga_r N$ (where $0<p\leq0.3, 0\leq q<1, 0<r<1$, and $p+q+r=1$) and said active layer being made of $B_x Al_y Ga_z N$ (where $0\leq x\leq0.3, 0\leq y<1, 0<z\leq1$ and $x+y+z=1$), said first cladding layer, said second cladding layer and said active layer being made at growth temperatures not lower than 1000 C.

22. The semiconductor light emitting device according to claim 21 wherein said active layer is made of $B_x Ga_z N$ (where $0\leq x\leq0.3, 0.7\leq z\leq1$, and $x+z=1$).

23. The semiconductor light emitting device according to claim 21 wherein said active layer is made of $Al_y Ga_z N$ (where $0\leq y<1, 0<z\leq1$, and $y+z=1$).

24. The semiconductor light emitting device according to claim 21 wherein said active layer is made of GaN.

25. The semiconductor light emitting device according to claim 21 wherein said light emitting structure further includes a first optical guide layer and a second optical guide layer between said first cladding layer and said active layer, and between said active layer and said second cladding layer, respectively, and said first optical guide layer and said second optical guide layer are made of $B_a Al_b Ga_c N$ (where $0\leq a\leq0.3, 0\leq b<1, 0<c<1$, and $a+b+c=1$).

26. The semiconductor light emitting device according to claim 21 wherein difference between the band gap of said first cladding layer and said second cladding layer and the band gap of said active layer is not less than 500 meV.

27. The semiconductor light emitting device according to claim 21 wherein difference between the B composition in said first cladding layer and said second cladding layer and the B composition in said active layer is not lower than 5%.

28. The semiconductor light emitting device according to claim 21 wherein the Al composition in said first cladding layer and said second cladding layer is not higher than 0.1, and the B composition therein is not higher than 0.1.

29. The semiconductor light emitting device according to claim 5 wherein said semiconductor layers constituting said light emitting structure are made on a substrate via a buffer layer, said buffer layer being made of $B_p Al_q Ga_r In_s N$ (where $0<p\leq1, 0\leq q<1, 0\leq r<1, 0\leq s<1$, and $p+q+r+s=1$).

30. The semiconductor light emitting device according to claim 29 wherein said light emitting structure has a structure interposing an active layer between a first cladding layer and a second cladding layer, and said buffer layer has a larger band gap than that of said active layer.

31. The semiconductor light emitting device according to claim 5 wherein said light emitting structure has a structure interposing an active layer between a first cladding layer and a second cladding layer, and includes a cap layer near said active layer to prevent evaporation of In, said cap layer being made of $B_p Al_q Ga_r In_s N$ (where $0<p\leq1, 0\leq q<1, 0<r<1, 0\leq s<1$, and $p+q+r+s=1$).

* * * * *